(12) United States Patent
Kim et al.

(10) Patent No.: US 9,496,389 B2
(45) Date of Patent: Nov. 15, 2016

(54) SEMICONDUCTOR DEVICES AND METHODS OF MANUFACTURING THE SAME

(71) Applicants: Yong-Don Kim, Suwon-si (KR); Se-Jin Park, Yongin-si (KR)

(72) Inventors: Yong-Don Kim, Suwon-si (KR); Se-Jin Park, Yongin-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 14/621,981

(22) Filed: Feb. 13, 2015

(65) Prior Publication Data
US 2015/0295082 A1  Oct. 15, 2015

(30) Foreign Application Priority Data
Apr. 15, 2014  (KR) .................. 10-2014-0044739

(51) Int. Cl.
*H01L 29/78* (2006.01)
*H01L 29/06* (2006.01)
(Continued)

(52) U.S. Cl.
CPC ....... *H01L 29/7816* (2013.01); *H01L 21/2253* (2013.01); *H01L 21/761* (2013.01); *H01L 29/0623* (2013.01); *H01L 29/0646* (2013.01); *H01L 29/0696* (2013.01); *H01L 29/1083* (2013.01); *H01L 29/36* (2013.01);
(Continued)

(58) Field of Classification Search
CPC ............ H01L 29/7816; H01L 29/0646; H01L 29/7818; H01L 29/7824; H01L 29/66681; H01L 27/1122; H01L 29/6659; H01L 29/7833; H01L 21/2253; H01L 29/36; H01L 29/66659; H01L 27/791; H01L
(Continued)

(56) References Cited

U.S. PATENT DOCUMENTS 5,629,543 A  5/1997  Hshieh et al.
6,441,437 B1  8/2002  Gossner
(Continued)

FOREIGN PATENT DOCUMENTS

KR  1993-0014957  7/1993
KR  10-1999-0049029 A  7/1999
(Continued)

*Primary Examiner* — Galina Yushina
(74) *Attorney, Agent, or Firm* — Lee & Morse, P.C.

(57) ABSTRACT

A semiconductor device includes at least one gate electrode on a substrate structure, at least one drain region doped with impurities of a first conductivity type, a first well region doped with impurities of the first conductivity type under the at least one drain region, and at least one source region doped with impurities of the first conductivity type. The device also includes a first barrier impurity region and a second barrier impurity region. The first barrier impurity region is doped with impurities of the first conductivity type and electrically insulating upper and lower portions of the substrate structure from each other. The second barrier impurity region is doped with impurities of a second conductivity type. A portion of the second barrier impurity region has an uneven shape and overlaps the at least one drain region.

20 Claims, 17 Drawing Sheets

(51) Int. Cl.
*H01L 21/225* (2006.01)
*H01L 29/36* (2006.01)
*H01L 29/66* (2006.01)
*H01L 21/761* (2006.01)
*H01L 29/10* (2006.01)

(52) U.S. Cl.
CPC ..... *H01L 29/66659* (2013.01); *H01L 29/7835* (2013.01); *H01L 29/0653* (2013.01)

(58) Field of Classification Search
CPC .................. 29/7835;H01L 29/0623; H01L 29/0695; H01L 29/1083
See application file for complete search history.

(56) References Cited

U.S. PATENT DOCUMENTS

| | | | |
|---|---|---|---|
| 6,828,631 B2 | 12/2004 | Rumennik et al. | |
| 6,855,964 B2 | 2/2005 | Hulfachor | |
| 6,902,967 B2 | 6/2005 | Beasom | |
| 6,958,515 B2 | 10/2005 | Hower et al. | |
| 7,126,191 B2 | 10/2006 | Fujii | |
| 7,279,399 B2 | 10/2007 | Williams et al. | |
| 7,489,007 B2 | 2/2009 | Williams et al. | |
| 7,605,428 B2 | 10/2009 | Williams et al. | |
| 7,605,433 B2 | 10/2009 | Williams et al. | |
| 7,745,883 B2 | 6/2010 | Williams et al. | |
| 8,236,642 B2 | 8/2012 | Wei et al. | |
| 2002/0053685 A1* | 5/2002 | Pendharkar | H01L 21/761 257/204 |
| 2004/0159891 A1* | 8/2004 | Nakamura | H01L 29/7801 257/355 |
| 2006/0097407 A1* | 5/2006 | Ito | H01L 24/03 257/784 |
| 2007/0246790 A1 | 10/2007 | Zinn et al. | |
| 2013/0072004 A1 | 3/2013 | Tsuchiko et al. | |
| 2015/0069509 A1* | 3/2015 | Lee | H01L 29/7816 257/343 |

FOREIGN PATENT DOCUMENTS

| | | |
|---|---|---|
| KR | 10-2004-0067057 A | 7/2004 |
| KR | 10-2010-0079083 A | 7/2010 |

* cited by examiner

SEMICONDUCTOR DEVICES AND METHODS OF MANUFACTURING THE SAME

CROSS-REFERENCE TO RELATED APPLICATION

Korean Patent Application No. 10-2014-0044739, filed on Apr. 15, 2014, and entitled, "Semiconductor Devices and Methods of Manufacturing the Same," is incorporated by reference herein in its entirety.

BACKGROUND

1. Field

One or more embodiments described herein relate to semiconductor devices and methods of manufacturing the same.

2. Description of the Related Art

In a semiconductor device such as but not limited to a buck-boost converter, a negative voltage is applied to a substrate as a back bias. An example of a semiconductor device which uses the negative voltage is a double diffused metal oxide silicon field effect transistor (DMOS FET).

SUMMARY

In accordance with one embodiment, a semiconductor device includes at least one gate electrode on a substrate structure; at least one drain region doped with impurities of a first conductivity type at a surface of the substrate structure spaced from a first side of the at least one gate electrode; a first well region doped with impurities of the first conductivity type under the at least one drain region, the first well region surrounding the at least one drain region; at least one source region doped with impurities of the first conductivity type at a surface of the substrate structure adjacent to a second side of the at least one gate electrode; a first barrier impurity region doped with impurities of the first conductivity type in the substrate structure, the first barrier impurity region electrically insulating upper and lower portions of the substrate structure from each other; and a second barrier impurity region doped with impurities of a second conductivity type different from the first conductivity type on an upper surface of the first barrier impurity region, the second barrier impurity region having a first portion and a second portion, the first portion overlapping the at least one drain region in a first direction which is substantially vertical relative to a top surface of the substrate structure, a lower surface of the first portion being lower than a lower surface of the second portion.

The semiconductor device may include a body region doped with impurities of the second conductivity type surrounding the source region and partially overlapping the at least one gate electrode; and a second well region doped with impurities of the second conductivity type on the first and the second barrier impurity regions, the second well region having an impurity concentration lower than an impurity concentration of the second barrier impurity region.

The semiconductor device may include a third barrier impurity region on a lower surface of the first barrier impurity region, the second and third barrier impurity regions being substantially symmetric with each other. The second barrier impurity region may be on a third portion of the first barrier impurity region, and the third portion may overlap the at least one drain region in the first direction. The second barrier impurity region may be on the first barrier impurity region and may cover substantially an entire upper surface of the first barrier impurity region.

The first barrier impurity region may have a third portion and a fourth portion, the third portion may overlap the at least one drain region in the first direction, and the third portion may has a first width in the first direction less than a second width of the fourth portion in the first direction. Upper and lower surfaces of the first barrier impurity region may be uneven, the fourth portion of the first barrier impurity region may have a convex shape, and the third portion of the first barrier impurity region may have a concave shape.

The third portion of the first barrier impurity region may have an impurity concentration lower than an impurity concentration of the fourth portion of the first barrier impurity region. The first barrier impurity region may have a smallest width in the first direction at a portion overlapping a center portion of the at least one drain region in a second direction substantially parallel to the top surface of the substrate structure. The second barrier impurity region may be on a portion of the first barrier impurity region having a smallest width in the first direction and a neighboring portion thereof.

The at least one gate electrode may include a plurality of gate electrodes electrically connected with each other, the at least one drain region may include a plurality of drain regions electrically connected with each other, and the at least one source region may include a plurality of source regions electrically connected with each other.

The at least one gate electrode may include a plurality of gate electrodes, and the semiconductor device may include battery parts at portions of the substrate structure adjacent ones of the plurality of gate electrodes at edge portions of the substrate structure. Each of the battery parts may include an impurity region doped with impurities of the first conductivity type, and may extend from a surface of the substrate structure to the first barrier impurity region. Portions of the first barrier impurity region may overlap the battery parts in the first direction and may have widths substantially equal to a greatest width of the first barrier impurity region under the at least one drain region and the at least one source region.

The substrate structure may include a base substrate and an epitaxial layer on the base substrate, and the first barrier impurity region may be at an interface between the base substrate and the epitaxial layer.

In accordance with another embodiment, a semiconductor device includes a gate electrode on a substrate structure; a drain region doped with impurities of a first conductivity type at a surface of the substrate structure spaced from a first side of the gate electrode; a first well region doped with impurities of the first conductivity type under the drain region, the first well region surrounding the drain region; a source region doped with impurities of the first conductivity type at a surface of the substrate structure adjacent to a second side of the gate electrode; a first barrier impurity region doped with impurities of the first conductivity type in the substrate structure, the first barrier impurity region electrically insulating upper and lower portions of the substrate structure from each other, the first barrier impurity region having a first portion and a second portion, the first portion overlapping the drain region in a first direction substantially vertical relative to a top surface of the substrate structure, a first width of the first portion in the first direction being less than a second width of the second portion in the first direction, each of upper and lower surfaces of the first barrier impurity region being uneven; and a second barrier impurity region doped with impurities of a second conductivity type different from the first conductivity type on the first barrier impurity region.

The semiconductor device may include a body region doped with impurities of the second conductivity type surrounding the source region and partially overlapping the gate electrode; and a second well region doped with impurities of the second conductivity type on the first and the second barrier impurity region, the second well region having an impurity concentration lower than an impurity concentration of the second barrier impurity region.

In accordance with another embodiment, a method for manufacturing a semiconductor device includes forming an ion implantation mask on a base substrate to cover a drain forming region; implanting impurities of a first conductivity type onto the base substrate using the implantation mask to form first preliminary impurity regions; implanting impurities of a second conductivity type different from the first conductivity type onto the base substrate to form a second preliminary impurity region between the first preliminary impurity regions; first diffusing the impurities in the first and the second preliminary impurity regions to connect the first preliminary impurity regions with each other, and to form a third preliminary impurity region from the first preliminary impurity regions and to form a fourth preliminary impurity region on the third preliminary impurity region from the second preliminary impurity region; forming an epitaxial layer on the base substrate to form a substrate structure; second diffusing the impurities in the third and the fourth preliminary impurity regions to form a first barrier impurity region of the first conductivity type between the epitaxial layer and the base substrate and a second barrier impurity region of the second conductivity type on the first barrier impurity region, each of upper and lower surfaces of the first barrier impurity region having an uneven shape, and a first portion of the first barrier impurity region overlapping the drain forming region in the first direction having a predetermined width in a first direction substantially vertical to a top surface of the substrate structure; forming a gate electrode on the substrate structure; forming a drain region doped with impurities of the first conductivity type at a surface of the substrate structure spaced from a first side of the gate electrode; forming a first well region doped with impurities of the first conductivity type under the drain region, the first well region surrounding the drain region; and forming a source region doped with impurities of the first conductivity type at a surface of the substrate structure adjacent to a second side of the gate electrode.

The first preliminary impurity region may have a first impurity concentration higher than a second impurity concentration of the second preliminary impurity region. The method may include forming a well region doped with impurities of the second conductivity type on the first and second barrier impurity regions, the well region having an impurity concentration less than an impurity concentration of the second barrier impurity region at an interface between the second barrier impurity region and the well region; and forming a body region doped with impurities of the second conductivity type to surround the source region and partially overlap the gate electrode.

The method may include doping impurities into the substrate structure adjacent the gate electrode at edge portions to form a battery part electrically connected to the first barrier impurity region. The implantation mask may expose a portion of the base substrate for forming the battery part, and each of upper and lower surfaces of the first barrier impurity region under the battery part may be substantially even.

A width in the second direction substantially parallel to a top surface of the substrate structure of the ion implantation mask may be in a range of about 0.8 μm to about 1.8 μm. The operation of forming the preliminary second impurity region may include removing the implantation mask; and doping impurities of the second conductivity type into substantially an entire surface of the base substrate structure. The first diffusing may be performed at a temperature of about 1000° C. to about 1200° C. for about 0.5 hours to about 5 hours.

In accordance with another embodiment, a semiconductor device includes first and second gates; source regions adjacent respective ones of the first and second gates; a drain region between the first and second gates and the source regions; a well region under the drain region; a first barrier impurity region under the well region; and a second barrier impurity region between the first barrier impurity region and the well region, wherein the first and second gates, the source regions, and the drain region correspond to a double diffused metal oxide silicon field effect transistor, and wherein the drain region, the first barrier impurity region, and the second barrier impurity region correspond to an emitter electrode, a collector electrode, and a base electrode of a parasitic bipolar junction transistor.

The second barrier impurity region may have a first width along a central axis of the drain region and second widths spaced from the central axis, wherein the first width is greater than the second widths. A width of the base electrode may be based on the first width of the second barrier impurity region. The second barrier impurity region may have a higher impurity concentration than the first barrier impurity region. A portion of the first barrier impurity region under the drain region may have a lower impurity concentration than a portion of the first barrier impurity region under the source regions.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
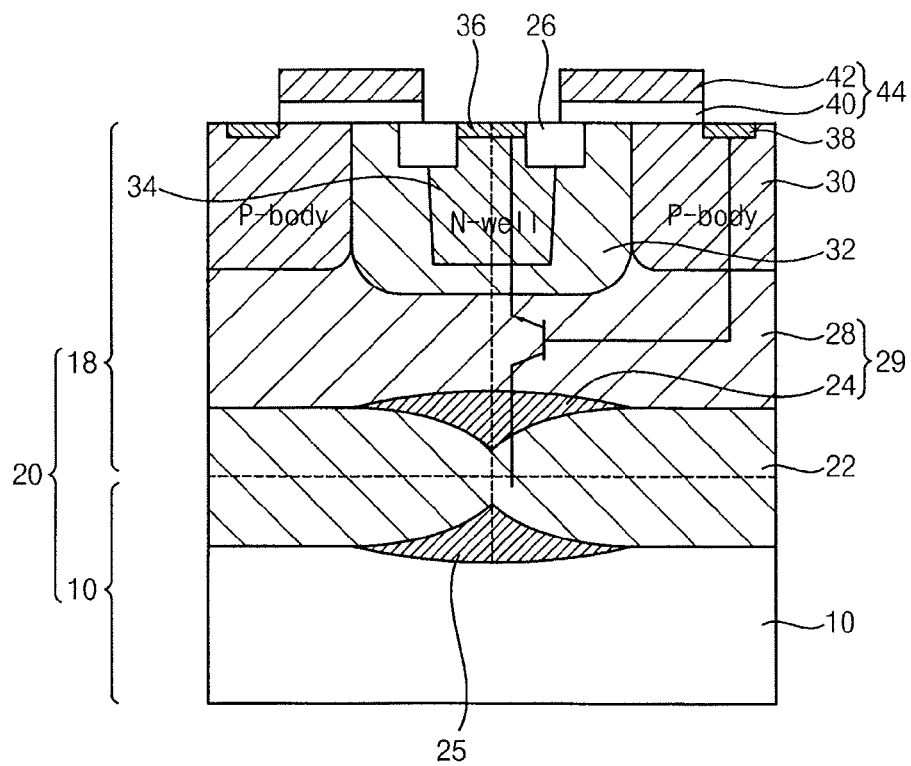
FIG. 1 illustrates an embodiment of a semiconductor device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawings, the dimensions of layers and regions may be exaggerated for clarity of illustration. Like reference numerals refer to like elements throughout.

It will be understood that when an element or layer is referred to as being "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 illustrates an embodiment of a semiconductor device which may include, for example, an n-type isolated DMOS FET. In another embodiment, the semiconductor device may include a p-type isolated DMOS FET.

Referring to FIG. 1, the semiconductor device includes a substrate structure 20 including a base substrate 10 and an epitaxial layer 18 on the base substrate 10. The base substrate 10 may be lightly doped with p-type impurities. The base substrate 10 may be, for example, a silicon substrate, a germanium substrate, or a compound semiconductor substrate. The base substrate 10 may be a lower portion of the substrate structure 20, and the epitaxial layer 18 may be an upper portion of the substrate structure 20. The epitaxial layer 18 may include a semiconductor layer formed, for example by an epitaxial growth process.

A gate electrode structure 44 includes a gate insulating layer pattern 40 and a gate electrode 42 formed on the epitaxial layer 18. The gate electrode 42 may include a semiconductor material doped with impurities, a metal, a conductive metal nitride, a metal-semiconductor compound, etc. The gate insulating layer pattern 40 may include an oxide, a nitride, an oxynitride, a metal oxide, etc.

In example embodiments, the semiconductor device may include a plurality of gate electrode structures 44 with gate electrodes 42 alternately and repeatedly formed in a second direction. The second direction may be, for example, substantially parallel to a top surface of the substrate structure 20. In an example embodiment, end portions of the gate electrodes 42 may be connected to each other. A portion of the epitaxial layer 18 adjacent to a first side of the gate electrode 42 may serve as a drain region. A portion of the epitaxial layer 18 adjacent to a second side opposite to the first side of the gate electrode 42 may serve as a source region.

In example embodiments, the drain and source regions may be alternately formed in the epitaxial layer 18 between the gate electrodes 42. For example, as shown in FIG. 1, portions of the epitaxial layer 18 between inner sides of the gate electrodes 42 may serve as a drain region. Portions of the epitaxial layer 18 adjacent to outer sides of the gate electrodes 42 may serve as source regions.

An n-type drift region 32 may be formed at the drain region of the epitaxial layer 18. The n-type drift region 32 may partially overlap the gate electrode structure 44.

An isolation pattern 26 may be formed in the n-type drift region 32. In example embodiments, a plurality of isolation patterns 26 may be formed and may not overlap a portion of the drain region on which a drain contact plug may be formed. The isolation pattern 26 may overlap an edge portion of the gate electrode structure 44. The isolation pattern 26 may include a nitride, an oxide, an oxynitride, etc. For example, the isolation pattern 26 may include silicon oxide.

A first well region 34 doped with n-type impurities may be formed in the n-type drift region 32. The first well region 34 may be disposed between the isolation patterns 26. A lower surface of the first well region 34 may be lower than those of the isolation patterns 26.

A first impurity region 36 doped with n-type impurities may be formed at a surface of the epitaxial layer 18 and spaced from the first side of the gate electrode 42. The drain contact plug may be formed on the first impurity region 36. The first impurity region 36 may be between the isolation patterns 26. The first impurity region 36 may be surrounded by the first well region 34 and the n-type drift region 32.

The drain region of the epitaxial layer 18 may be doped with n-type impurities.

A P-body region 30 doped with p-type impurities may be formed in the source regions of the epitaxial layer 18. The P-body region 30 may be adjacent to the n-type drift region 32, and may overlap the gate electrode structure 44. A lower surface of the P-body region 30 may be lower than those of the isolation patterns 26.

A second impurity region 38 doped with n-type impurities may be formed in the p-body region 30. The second impurity region 38 may be formed at a surface of the epitaxial layer 18 to be adjacent to the second side of the gate electrode 42. A source contact plug may be formed on the second impurity region 38.

A first barrier impurity region 22 doped with n-type impurities may be formed in the substrate structure 20. An upper portion of the substrate structure 20 (e.g., the epitaxial layer 18) and a lower portion of the substrate structure 20 (e.g., the base substrate 10) may be electrically insulated from each other by the first barrier impurity region 22.

A second barrier impurity region 24 doped with p-type impurities may contact an upper portion of the first barrier impurity region 22. Also, a third barrier impurity region 25 doped with p-type impurities may contact a lower portion of the first barrier impurity region 22. The second and third barrier impurity regions 24 and 25 may be symmetric with respect to the first barrier impurity region 22.

The second barrier impurity region 24 may include a first portion overlapping the drain region in a first direction substantially vertical to the top surface of the substrate structure 20 and a second portion that may be other portions of the second barrier impurity region 24. A lower surface of the first portion of the second barrier impurity region 24 may be lower than that of the second portion of the second barrier impurity region 24.

A p-type well region 28 doped with p-type impurities may be formed on the first and second barrier impurity regions 22 and 24. The p-type well region 28 may be formed under the P-body region 30 and the n-type drift region 32. The p-type well region 28 may have an impurity concentration lower than that of the second barrier impurity region 24.

A second well region 29 including the second barrier impurity region 24 and the p-type well region 28 may be formed between the n-type drift region 32 and the first barrier impurity region 22 and between the P-body region 30 and the first barrier impurity region 22. The second well region 29 may be doped with p-type impurities. Therefore, a region of the substrate structure 20, in which impurities are doped above the first barrier impurity region 22, may be doped with p-type impurities except for the drain regions. A lower surface of the second well region 29 may contact the first barrier impurity region 22. Thus, the lower surface of the second well region 29 may have substantially the same shape as that of an upper surface of the first barrier impurity region 22.

The first barrier impurity region 22 may include a third portion having a first width in the first direction and a fourth portion having a second width in the first direction. The second width may be greater than the first width. The third portion may overlap the drain region in the first direction. The fourth portion may be other portions of the first barrier impurity region 22. The first barrier impurity region 22 may have a smallest width in the first direction at a center portion thereof and may overlap a center portion of the first impurity region 36 in the second direction. The first width may gradually increase from the center portion toward an edge portion in the second direction. The second width may be substantially constant.

The upper and lower surfaces of the first barrier impurity region 22 may be symmetric with each other. The fourth portion of the first barrier impurity region 22 may have a convex shape. The third portion of the first barrier impurity region 22 may have a concave shape. Thus, the upper and lower surfaces of the first barrier impurity region 22 may have an uneven shape.

The third and fourth portions of the first barrier impurity region 22 may have first and second impurity concentrations, respectively. The second impurity concentration may be higher than the first impurity concentration. An n-type impurity concentration of the first barrier impurity region 22 may be gradually decreased as the width in the first direction of the first barrier impurity region 22 decreases. Thus, the third portion of the first barrier impurity region 22 may have a resistance higher than that of fourth portion of the first barrier impurity region 22.

The first barrier impurity region 22 may be formed at an interface between the epitaxial layer 18 and the base substrate 10. The first barrier impurity region 22 may not be disconnected at the third portion, so that the upper and lower portions of the substrate structure 20 may be electrically insulated by the first barrier impurity region 22. Thus, the smallest width in the first direction of the first barrier impurity region 22 may be determined so that the upper and lower portions of the substrate structure 20 are electrically insulated.

The second barrier impurity region 24 may contact the concave portion of the first barrier impurity region 22. The second barrier impurity region 24 may be formed on a portion having the smallest width in the first direction of the first barrier impurity region 22 and a neighboring portion thereof. For example, the second barrier impurity region 24 may overlap the drain region in the first direction.

In a doping profile of the second well region 29, the p-type well region 28 may have a p-type impurity concentration in a given range. The second barrier impurity region 24 may have a p-type impurity concentration higher than that of the p-type well region 28. The second barrier impurity region 24 and p-type well region 28 may be formed, for example, by different doping processes.

The second well region 29 may have a first depth from the top surface of the substrate structure 20 at a portion overlapping the drain region in the first direction and a second depth from the top surface of the substrate structure 20 at other portions. The second depth may be smaller than the first depth.

When an isolated DMOS FET having the aforementioned structure is operated, a channel may be formed at a portion of the P-body region 30 overlapping the gate electrode structure 44. According to the formation of the channel, electric carriers may drift between the source and drain regions through the n-type drift region 32.

The DMOS transistor may include the n-type drift region 32, the second well region 29, and the first barrier impurity region 22 in the first direction from the top surface of the substrate structure 20. For example, junctions of an n-type doping region, a p-type doping region, and an n-type doping region may be formed. Thus, a parasitic NPN BJT may be formed. The n-type drift region 32, the second well region 29, and the first barrier impurity region 22 may respectively serve as an emitter electrode, a base electrode, and a collector electrode of the parasitic NPN BJT.

When the isolated DMOS FET is operated, the parasitic NPN BJT may be unexpectedly operated. If the parasitic NPN BJT is operated, a collector current of the parasitic NPN BJT may flow. Thus, leakage current may be generated. Therefore, an operation of the parasitic NPN bipolar junction transistor (BJT) should be prevented and/or the leakage current should be reduced in the isolated DMOS FET.

In order to decrease the collector current of the parasitic NPN BJT, a beta ($\beta$) value that is the collector current/the base current ($\beta=Ic/Ib$) may be reduced in the parasitic NPN BJT. Thus, a width and/or a p-type impurity concentration of the base electrode may be increased. Also, a resistance of the collector electrode may be increased.

In example embodiments, a lower surface of the second well region 29 may not be flat. A portion of the lower surface of the second well region 29 under the drain region may be relatively low. Thus, the width in the first direction of the second well region 29 under the drain region may be large, so that the width of the base electrode may be large. Also, in the parasitic NPN BJT under the drain region, the second barrier impurity region 24 contacting the first barrier impurity region 22 may have a relatively high impurity concentration, so that the p-type impurity concentration of the base electrode may be high. Also, a portion of the first barrier impurity region 22 overlapping the drain region may have an impurity concentration lower than that of other portions of the first barrier impurity region 22, so that a resistance of the collector electrode may be high. Thus, operation of the parasitic NPN BJT may not be active, and the leakage current and/or consumption of power of the isolated DMOS FET due to the operation of the parasitic NPN BJT may be decreased.

Figure 2:
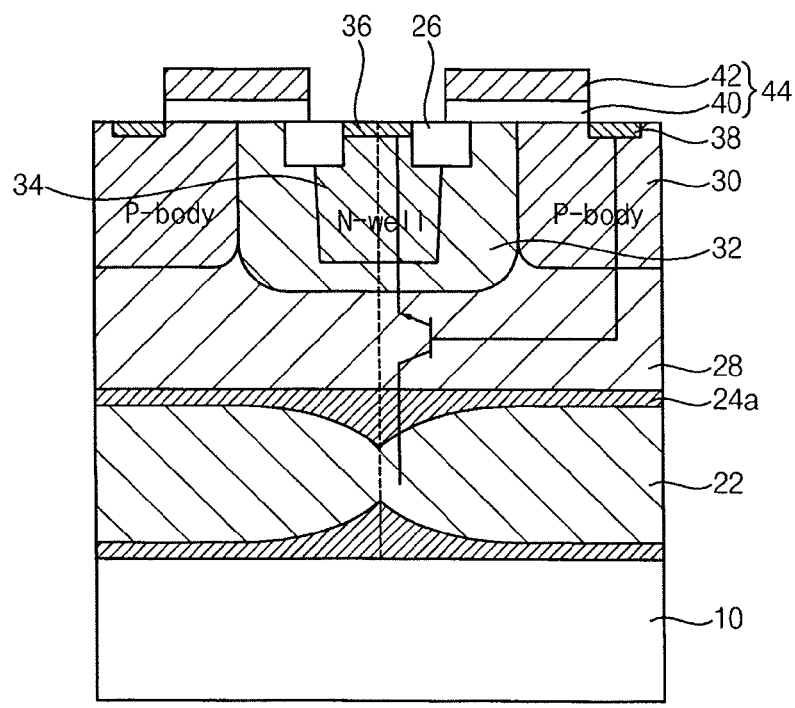
FIG. 2 illustrates another embodiment of a semiconductor device.

FIG. 2 illustrates another embodiment of a semiconductor device, which may be substantially the same as the embodiment of FIG. 1, except for shapes of the second barrier region and the P-type well region in the second well region.

Referring to FIG. 2, a second barrier impurity region 24a may contact an entire upper surface of the first barrier impurity region 22. The second barrier impurity region 24a may have a first depth in the first direction from the top surface of the substrate structure 20 at a portion overlapping the drain region, and a second depth in the first direction from the top surface of the substrate structure 20 at other portions. The second depth may be less than the first depth.

A p-type well region 28 may be formed on the second barrier impurity region 24a. The second barrier impurity region 24a may have an impurity concentration higher than that of the p-type well region 28. For example, a portion of the second barrier impurity region 24a contacting the concave portion of the first barrier impurity region 22 may have an impurity concentration higher than that of other portions of the second barrier impurity region 24a.

In the semiconductor device, the width in the first direction and the impurity concentration of the second well region 29 (serving as a base electrode in a parasitic NPN BJT) may increase. As a result, operation of the parasitic NPN BJT may be prevented.

Figure 3:
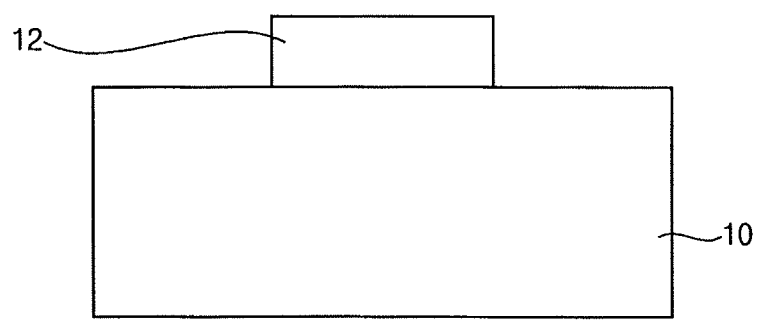
FIGS. 3 to 10 illustrate operations included in one embodiment of a method for manufacturing the semiconductor device in FIG. 1.

FIGS. 3 to 10 are cross-sectional views illustrating operations included in one embodiment of a method for manufacturing the semiconductor device of FIG. 1. Referring to FIG. 3, a base substrate 10 lightly doped with p-type impurities may be provided.

An ion implantation mask 12 may be formed on the base substrate 10. The ion implantation mask 12 may be, e.g., a photoresist pattern. The ion implantation mask 12 may serve as a mask to form a first barrier impurity region 22 (refer to FIG. 8). The ion implantation mask 12 may cover a portion of the base substrate 10 in which a drain region may be formed, and may expose other portions of the base substrate 10. The ion implantation mask 12 may expose portions of the base substrate 10 corresponding to the first barrier impurity region 22 having a relatively wide width in a first direction substantially vertical to a top surface of the base substrate 10.

In example embodiments, a plurality of ion implantation masks 12 may be formed to be spaced from each other. Each of the ion implantation masks 12 may have a third width in a second direction, which is substantially parallel to the top surface of the base substrate 10. When the third width in the second direction increases, a width in the second direction of an n-type doping region for forming the first barrier impurity region 22 may be decreased. When the third width in the second direction increases, a width in the second direction of a p-type doping region for forming a second barrier impurity region 24 (refer to FIG. 8) may be increased. By increasing the third width in the second direction, an n-type dopant of the first barrier impurity region 22 may decrease and a p-type dopant of the second barrier impurity region 24 may increase.

The third width in the second direction of the ion implantation mask 12 may be determined so that the first barrier impurity region 22 is continuously formed by subsequent processes, and may electrically insulate upper and lower portions of a substrate structure 20 (refer to FIG. 7) that are subsequently formed from each other. For example, the third width in the second direction may be in a range of about 0.8 µm to about 2 µm.

Figure 4:
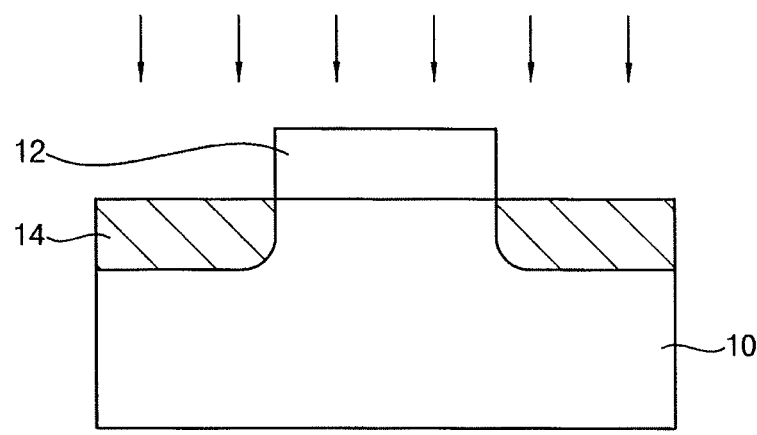

Referring to FIG. 4, n-type impurities may be doped onto the base substrate 10 using the ion implantation mask 12 to form a first preliminary impurity region 14. The first preliminary impurity region 14 may have a first impurity concentration. The n-type impurities may include, e.g., arsenic, phosphorus, etc. For example, arsenic ions may be implanted onto the base substrate 10 using an energy of about 50 eV to about 100 eV. Thus, the first preliminary impurity region 14 may be formed to have a doping concentration of about $1E15/cm^2$ to about $5E15/cm^2$.

Figure 5:
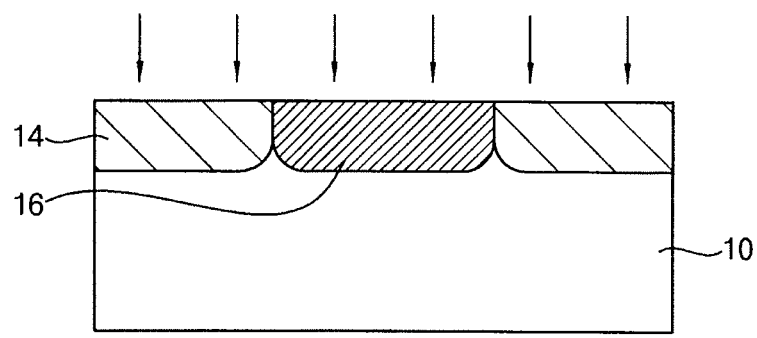

Referring to FIG. 5, the ion implantation mask 12 may be removed, for example, by an ashing process and/or a stripping process. P-type impurities may be doped onto the base substrate 10, with no ion implantation mask, to form a second preliminary impurity region 16. The second preliminary impurity region 16 may be formed between the first preliminary impurity regions 14.

The second preliminary impurity region 16 may have a second impurity concentration lower than the first impurity concentration of the first preliminary impurity region 14. The second impurity concentration may be about 1/10 to about 1/100 of the first impurity concentration. For example, boron ions may be implanted onto the base substrate 10 using an energy of about 10 eV to about 100 eV. Thus, the second preliminary impurity region 16 may be formed to have a doping concentration of about $1E14/cm^2$ to $10E14/cm^2$.

Figure 6:
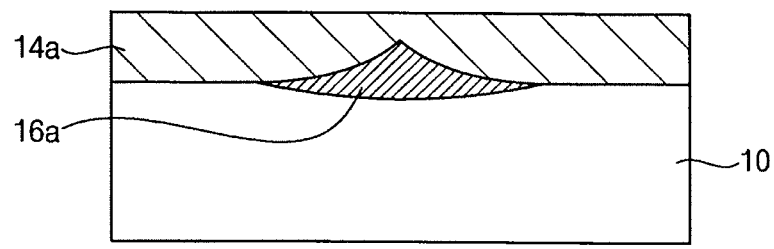

Referring to FIG. 6, impurities of the first and second preliminary impurity regions 14 and 16 may be diffused, for example, by a first drive-in process. By the first drive-in process, n-type impurities of the first preliminary impurity regions 14 are diffused in the first and second directions, so that the first preliminary impurity regions 14 may be connected to each other to form a third preliminary impurity region 14a.

In the third preliminary impurity region 14a, portions initially doped with n-type impurities may have a width in the first direction greater than that of a portion made by the diffusion of the n-type impurities between the first preliminary impurity regions 14. Thus, a fourth portion of the third preliminary impurity region 14a may have a lower surface having a convex shape. A third portion of the third preliminary impurity region 14a may have a lower surface having a concave shape. The third portion may overlap a drain forming region in a first direction, and the fourth portion may be other portions. Also, the third portion of the third preliminary impurity region 14a may have an impurity concentration lower than that of the fourth portion of the fourth preliminary third impurity region 14a.

Further, by the first drive-in process, p-type impurities of the second preliminary impurity region 16 may be diffused in the first and second directions, so that a fourth preliminary impurity region 16a may be formed. The fourth preliminary impurity region 16a may contact the concave portion of the third preliminary impurity region 14a.

For example, the first drive-in process may be performed at a temperature of about 1000° C. to about 1200° C. for about 0.5 hours to about 5 hours. However, conditions of the drive-in process may be different in other embodiments.

Figure 7:
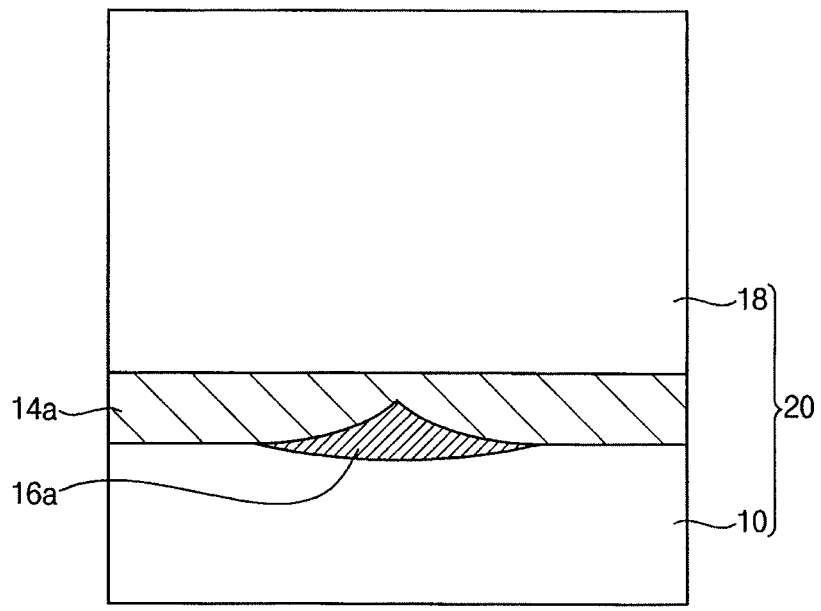

Referring to FIG. 7, an epitaxial layer 18 may be formed on the base substrate 10, for example, by an epitaxial growth process. Thus, the substrate structure 20 including the base substrate 10 and the epitaxial layer 18 may be formed. The epitaxial layer 18 may include, e.g., a semiconductor layer. The epitaxial layer 18 may have a predetermined or optimized thickness to form a semiconductor device. For example, the epitaxial layer 18 may have a thickness of about 4 μm to about 10 μm. However, the thickness of the epitaxial layer 18 may be different in other embodiments.

Figure 8:
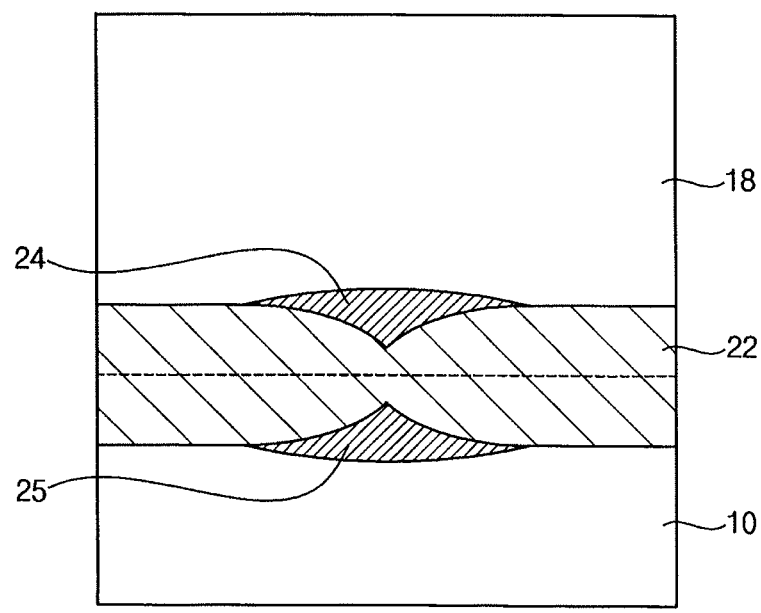

Referring to FIG. 8, a second drive-in process may be performed onto the substrate structure 20. By the second drive-in process, n-type impurities of the third preliminary impurity region 14a may be diffused to the epitaxial layer 18, so that the first barrier impurity region 22 may be formed. The third portion of the first barrier impurity region 22 may have a first width in the first direction smaller than a second width of the fourth portion of the first barrier impurity region 22.

Upper and lower portions of the first barrier impurity region 22 may be symmetric with each other. The fourth portion of the first barrier impurity region 22 may have a relatively convex shape. The third portion of the first barrier impurity region 22 may have a concave shape. Thus, each of the upper and lower surfaces of the first barrier impurity region 22 may have an uneven shape. The fourth portion of the first barrier impurity region 22 may have a second impurity concentration higher than a first concentration of the third portion of the first barrier impurity region 22.

The third portion of the first barrier impurity region 22 may be formed not to be disconnected, so that the upper and lower portions of the substrate structure 20 may be electrically insulated by the first barrier impurity region 22. Therefore, the smallest width in the first direction of the first barrier impurity region 22 may be determined so that the upper and lower portions of the substrate structure 20 may be electrically insulated.

Further, by the second drive-in process, p-type impurities of the fourth preliminary impurity region 16a may be diffused to the epitaxial layer 18, so that the second barrier impurity region 24 and a third impurity region 25 may be respectively formed on upper and lower surfaces of the first barrier impurity region 22. Each of the second and third barrier impurity regions 24 and 25 may be formed on the concave portion of the first barrier impurity region 22. In example embodiments, as shown in FIG. 1, each of the second and third barrier impurity regions 24 and 25 may be formed at an isolated position on the first barrier impurity region 22.

Alternatively, the diffusion of p-type impurities may be controlled by the second drive-in process so that each of the second and third barrier impurity regions 24 and 25 may be formed to extend in the second direction on the first barrier impurity region 22, as shown in FIG. 2.

The second drive-in process may be performed, for example, at a temperature of about 1000° C. to about 1200° C. for about 2 hours to about 10 hours. However, conditions of the second drive-in process may be different in other embodiments. Also, the impurities doped into the substrate structure 20 may be further diffused by a subsequent process, e.g., a heating process.

Figure 9:
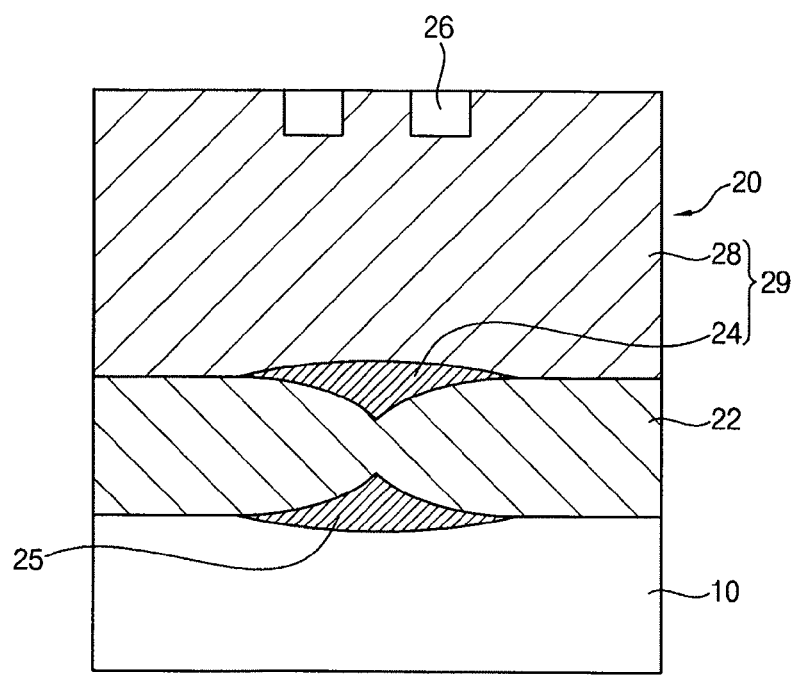

Referring to FIG. 9, an isolation pattern 26 may be formed at an upper portion of the substrate structure 20 by a shallow trench isolation (STI) process. In example embodiments, a plurality of isolation patterns 26 may be formed. The drain regions may be disposed between the isolation patterns 26.

P-type impurities may be doped onto the substrate structure 20 to form a second well region 29 including the second barrier impurity region 24 and a p-type well region 28. By doping the p-type impurities, an impurity concentration of the second barrier impurity region 24 may be increased. The second barrier impurity region 24 may have an impurity concentration higher than that of the p-type well region 28.

Figure 10:
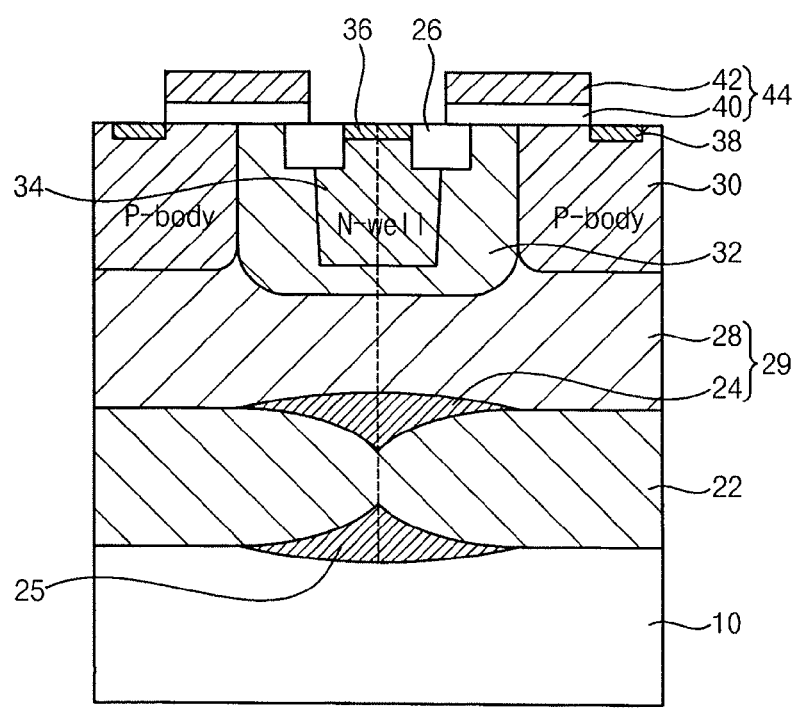

Referring to FIG. 10, p-type impurities may be doped onto a portion of the source region of the substrate structure 20 to form a P-body region 30. N-type impurities may be doped onto a portion of the drain region of the substrate structure 20 to form an n-type drift region 32. Also, n-type impurities may be doped onto a portion between the isolation patterns 26 to form a first well region 34 in the n-type drift region 32.

A gate insulating layer and a gate electrode layer may be formed on the substrate structure 20. The gate insulating layer and a gate electrode layer may be patterned to form a gate electrode structure 44. The gate electrode structure 44 may include a gate insulating layer pattern 40 and a gate electrode 42 sequentially stacked.

N-type impurities may be doped onto the substrate structure 20 between the gate electrodes 42 to form first and second impurity regions 36 and 38, respectively. The first and second impurity regions 36 and 38 may respectively serve as drain and source regions of an isolated DMOS FET. The second impurity region 38 may be formed in the P-body region 30. The first impurity region 36 may be formed in the first well region 34 of the substrate structure 20 between the isolation patterns 26. Thus, in accordance with the aforementioned method, the semiconductor device of FIG. 1 may be manufactured.

Figure 11:
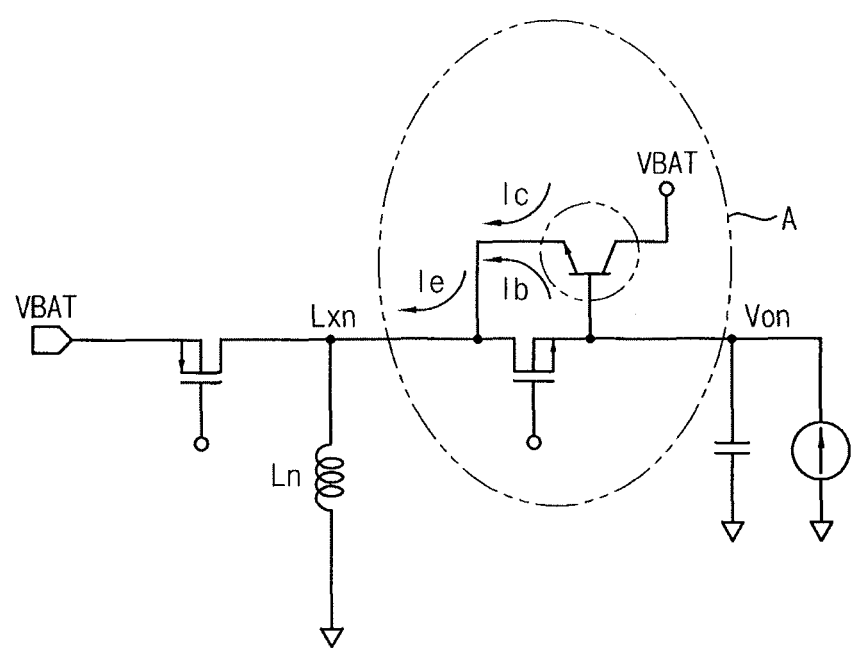
FIG. 11 illustrates a buck-boost converter in an n-type isolated DMOS FET.
Figure 12:
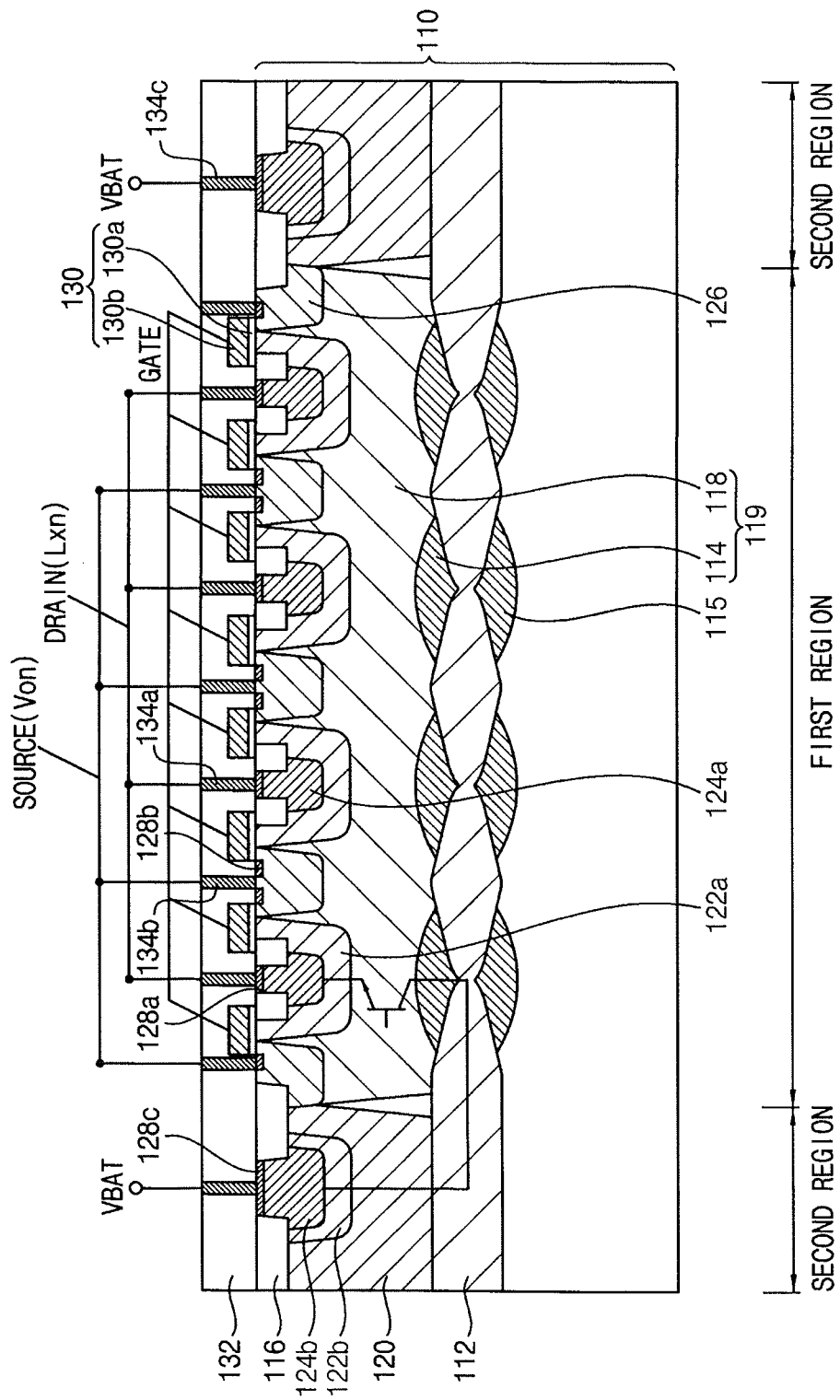
FIG. 12 illustrates another embodiment of a semiconductor device.
Figure 13:
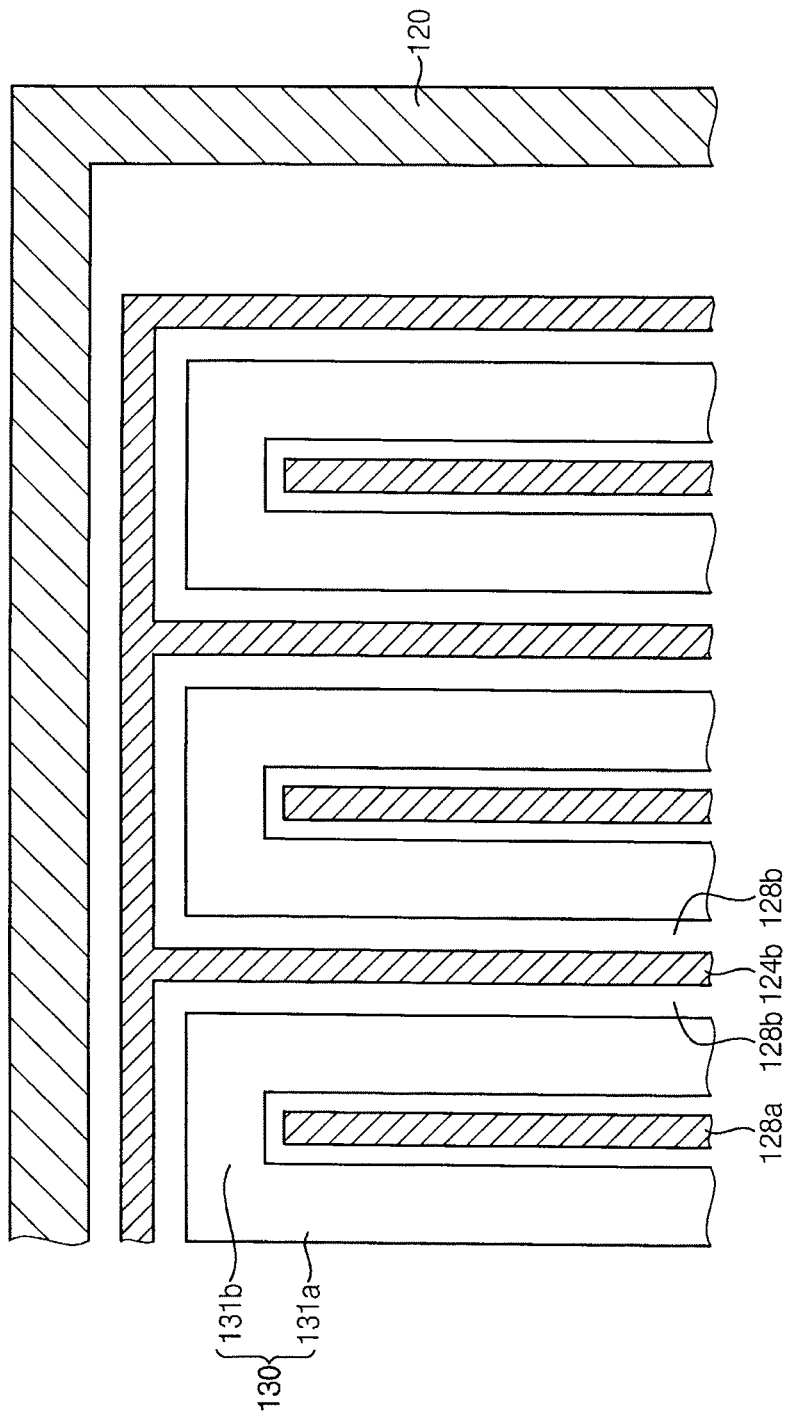
FIG. 13 illustrates an embodiment including a multi-finger gate in the semiconductor device of FIG. 12.

FIG. 11 illustrates an example of a buck-boost converter in an n-type isolated DMOS FET. FIG. 12 is a cross-sectional view illustrating an embodiment of a semiconductor device. FIG. 13 is a plan view illustrating a portion of a multi-finger gate in the semiconductor device of FIG. 12. FIG. 12 is a cross-sectional view of a portion "A" of FIG. 11 in the buck-boost converter.

Referring to FIGS. 12 and 13, the semiconductor device may include a substrate structure 110 including a base substrate and an epitaxial layer on the base substrate. The substrate structure 110 may include a first region for forming a MOSFET and a second region for forming a battery part for being connected to a battery. A gate electrode pattern 130 may be formed on the first region of the epitaxial layer, and may include a gate insulating layer pattern 130a and a gate electrode 130b that are sequentially stacked.

In example embodiments, as shown in FIG. 13, the gate electrode pattern 130 may include a plurality of gate electrode portions 131a spaced from each other and a connecting portion 131b that may connect the gate electrode portions 131a with each other. The gate electrode portions 131a may be electrically connected to each other by the connecting portion 131b. The gate electrode pattern 130 may have a predetermined shape, e.g., a finger shape.

For example, a portion of the substrate structure 110 between inner sides of the gate electrode patterns 130 may serve as a drain region. Portions of the substrate structure 110 adjacent to outer sides of the gate electrode patterns 130 may serve as source regions. The drain and source regions may be alternately formed in the substrate structure 110 between the gate electrode patterns 130.

A first impurity region 128a, a first well region 124a, and a first n-type drift region 122a may be formed under the drain region of the substrate structure 110, and may be substantially the same as those illustrated with reference to FIG. 1.

An isolation pattern 116 may be formed in the first n-type drift region 122a. The first well region 124a doped with n-type impurities may be formed in the first n-type drift region 122a. The first impurity region 128a doped with n-type impurities may be formed at a surface of the substrate structure 110 to be spaced from a first side of the gate electrode pattern 130. The first impurity region 128a may be between the isolation patterns 116. A region of the epitaxial layer in which impurities are doped under the drain region may be mostly doped with n-type impurities.

A second impurity region 128b and a P-body region 126 may be formed in the source region of the substrate structure 110, and may be substantially the same as those illustrated in FIG. 1. A region of the epitaxial layer in which impurities are doped in the source region may be mostly doped with n-type impurities.

A second well region 119 may surround the P-body region 126 and the first n-type drift region 122a. The second well region 119 may be doped with p-type impurities. A first barrier impurity region 112 may be formed under the second well region 119. An upper portion of the substrate structure 110 (e.g., the epitaxial layer) and a lower portion of the substrate structure 110 (e.g., the base substrate) may be electrically insulated from each other by the first barrier impurity region 112. The first barrier impurity region 112 may be doped with n-type impurities different from those of the second well region 119. The first barrier impurity region 112 and the second well region 119 may be substantially the same as those illustrated in FIG. 1.

The first barrier impurity region 112 in the first region may include a third portion having a first width in the first direction and a fourth portion having a second width in the first direction greater than the first width. The third portion may overlap the drain region in the first direction. The fourth portion may be other portions of the first barrier impurity region 112. However, the first barrier impurity region 112 in the second region may have a third width in the first direction greater than the first width, and may have flat bottom and top surfaces. The third width may be substantially the same as or greater than the second width. For example, the third width may be substantially the same as a greatest width in the first direction of the fourth portion.

The second well region 119 may include a second barrier impurity region 114 and a p-type well region 118. The second barrier impurity region 114 may be formed on the concave portion of an upper surface of the first barrier impurity region 112. The third barrier impurity region 115 may be formed on the concave portion of a lower surface of the first barrier impurity region 112. In example embodiments, the second and third barrier impurity regions 114 and 115 may be symmetric with respect to the first barrier impurity region 112. The second barrier impurity region 114 may have an impurity concentration higher than that of the p-type well region 118 adjacent to the second barrier impurity region 114. The second barrier impurity region 114 and p-type well region 118 may be formed, for example, by different doping processes.

The second well region 119 may have a first depth from the top surface of the substrate structure 110 at a first portion overlapping the drain region in the first direction, and a second depth from the top surface of the substrate structure 110 at other portions. The first depth may be greater than the second depth. For example, the lower surface of the first portion may be lower than those of the other portions in the second well region 119.

The drain regions may be alternately and repeatedly formed to be spaced from each other. Thus, each of the upper and lower surfaces of the first barrier impurity region 112 in the first region may have concave and convex portions that are alternately formed. The concave portions may be formed at the third portions of the first barrier impurity region 112 under the drain regions, respectively. The convex portions may be formed at other portions of the first barrier impurity region 112. Thus, each of the upper and lower surfaces of the first barrier impurity region 112 may have an uneven shape.

A third well region 120 may be formed in the second region of the substrate structure 110 and in contact the first barrier impurity region 112. The third well region 120 may be doped with n-type impurities. Thus, the third well region 120 may be electrically connected to the first barrier impurity region 112.

A second n-type drift region 122b may be formed in the third well region 120. A fourth well region 124b doped with n-type impurities may be formed in the second n-type drift region 122b. A third impurity region 128c may be formed at a surface of the substrate structure 110 in the second region. The third impurity region 128c may be formed in the fourth well region 124b, and may be doped with n-type impurities.

In example embodiments, the first and second n-type drift regions 122a and 122b may have substantially the same doping concentration and the same depth. Also, the first and fourth well regions 124a and 124b may have substantially the same doping concentration and the same depth. However, these depths and doping concentrations may be different in other embodiments.

An insulating interlayer 132 may be formed on the substrate structure 110 to cover the gate electrode pattern 130. A first contact plug 134a, a second contact plug 134b, and a third contact plug 134c may be formed through the insulating interlayer 132. Also, wire structures may be formed on the first to third contact plugs 134a, 134b, and 134c.

The first contact plug 134a may contact the first impurity region 128a. The second contact plug 134b may contact the second impurity region 128b. The third contact plug 134c may contact the third impurity region 128c, and may be electrically connected to the battery, e.g., a Li-ion battery.

The semiconductor device may include a parasitic NPN BJT structure of junctions of the first n-type drift region 122a, the second well region 119, and the first barrier impurity region 112. A collector electrode of the parasitic NPN BJT structure may be electrically connected to the battery part.

Referring to FIG. 11, when the semiconductor device is operated, a time interval may be generated in which a first MOSFET directly connected to a battery VBAT is turned on and an isolated DMOSFET formed behind a coil node Lxn is turned off. During this time interval, a voltage drop of a diode turn-on voltage may be generated in an inductor node portion, so that a parasitic NPN BJT structure may be operated. Thus, currents may flow from the battery electrically connected to the collector electrode of the parasitic NPN BJT structure, to thereby discharge the battery.

However, in example embodiments, the second well region 119 (which serves as a base electrode of the parasitic NPN BJT structure) may have a relatively wide width in the first direction and a relatively high impurity concentration. Also, the first barrier impurity region 112 may have a relatively low impurity concentration at the portion overlapping the drain region. Thus, operation of the parasitic NPN BJT may not be active, and consumption of the battery due to operation of the parasitic NPN BJT may decrease.

Figure 14:
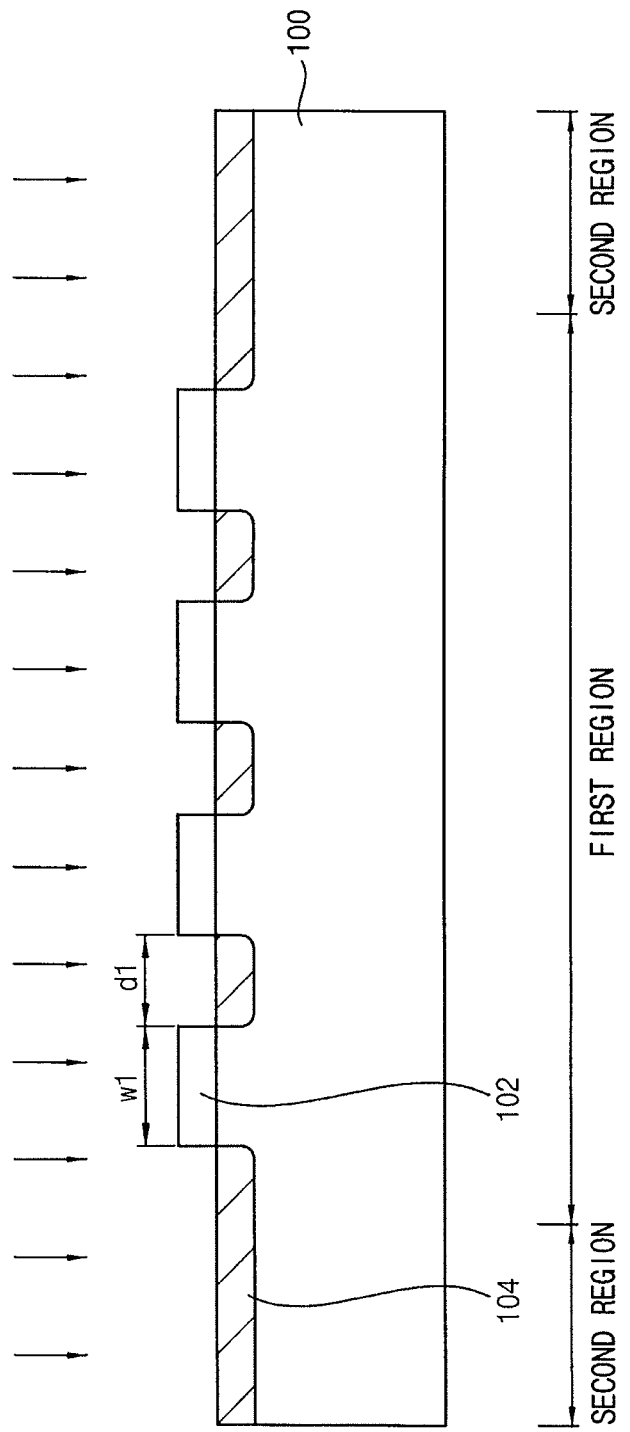
FIGS. 14 to 20 illustrate operations included in an embodiment of a method for manufacturing the semiconductor device in FIG. 12.

FIGS. 14 to 20 illustrate operations included in an embodiment of a method for manufacturing the semiconductor device of FIG. 12. Referring to FIG. 14, a base substrate 100 lightly doped with p-type impurities is provided.

An ion implantation mask 102 is formed on the base substrate 100. The ion implantation mask 102 may be, e.g., a photoresist pattern. The ion implantation mask 102 may serve as a mask to form a first barrier impurity region 112 (refer to FIG. 12). The ion implantation mask 102 may cover a portion of the base substrate 100 in which a drain region may be formed, and may expose other portions of the base substrate 100. The ion implantation mask 102 may expose portions of the base substrate 100 corresponding to the first barrier impurity region 112 having a relatively wide width in a first direction, which, for example, is substantially vertical to a top surface of the base substrate 100.

In example embodiments, a plurality of ion implantation masks 102 may be spaced from each other and may have a first interval d1 in a second direction, which, for example, is substantially parallel to the top surface of the base substrate 100. Each of the ion implantation masks 102 may have a first width w1 in the second direction. When the first width w1 in the second direction increases, an n-type dopant of the first barrier impurity region 112 may decrease and a p-type dopant of the second barrier impurity region 114 (refer to FIG. 12) may increase. The first width w1 in the second direction of the ion implantation mask 112 may be determined so that the first barrier impurity region 112 may electrically insulate upper and lower portions of a substrate structure 110 (refer to FIG. 17) subsequently formed from each other.

When the first width w1 in the second direction is smaller than a predetermined value (e.g., about 0.8 m), the second barrier impurity region 114 may not be formed to have a target impurity concentration. When the first width w1 in the second direction is greater than a predetermined value (e.g., about 1.8 m), the second barrier impurity region 114 may not be continuously formed, so that upper and lower portions of the substrate structure 110 that are subsequently formed may not be electrically insulated from each other. Thus, the first width w1 in the second direction may be in a predetermined range, e.g., about 0.8 µm to about 2 µm. This range may be different in other embodiments.

N-type impurities may be doped onto the base substrate 100 using the ion implantation mask 102 to form a first preliminary impurity region 104. The first preliminary impurity region 104 may have a first impurity concentration. The n-type impurities may include, e.g., arsenic, phosphorus, etc. For example, arsenic ions may be implanted onto the base substrate 100 using an energy of about 50 eV to about 100 eV. Thus, the first preliminary impurity region 104 may be formed to have a doping concentration of about $1E15/cm^2$ to about $5E15/cm^2$.

Figure 15:
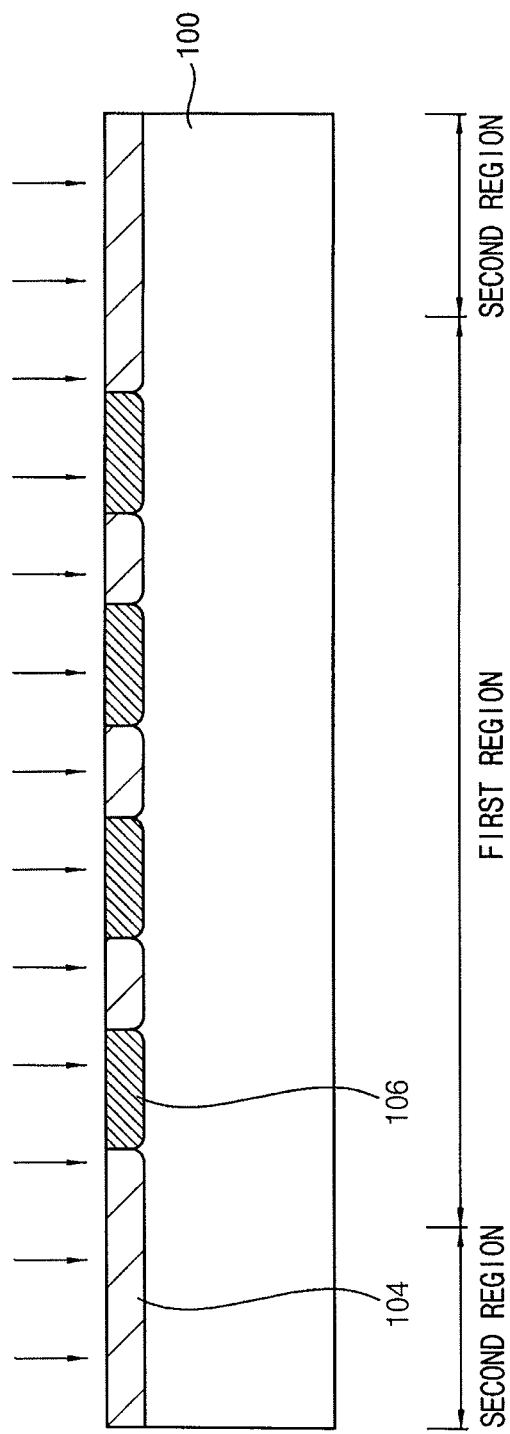

Referring to FIG. 15, the ion implantation mask 102 may be removed, for example, by an ashing process and/or a stripping process. P-type impurities may be doped onto the base substrate 100 to form a second preliminary impurity region 106 between the first preliminary impurity regions 104. The second preliminary impurity region 106 may have a second impurity concentration lower than the first impurity concentration of the first preliminary impurity region 104. For example, boron ions may be implanted onto the base substrate 100 using an energy of about 10 eV to about 100 eV. Thus, the second preliminary impurity region 106 may be formed to have a doping concentration of about $1E14/cm^2$ to $10E14/cm^2$.

Figure 16:
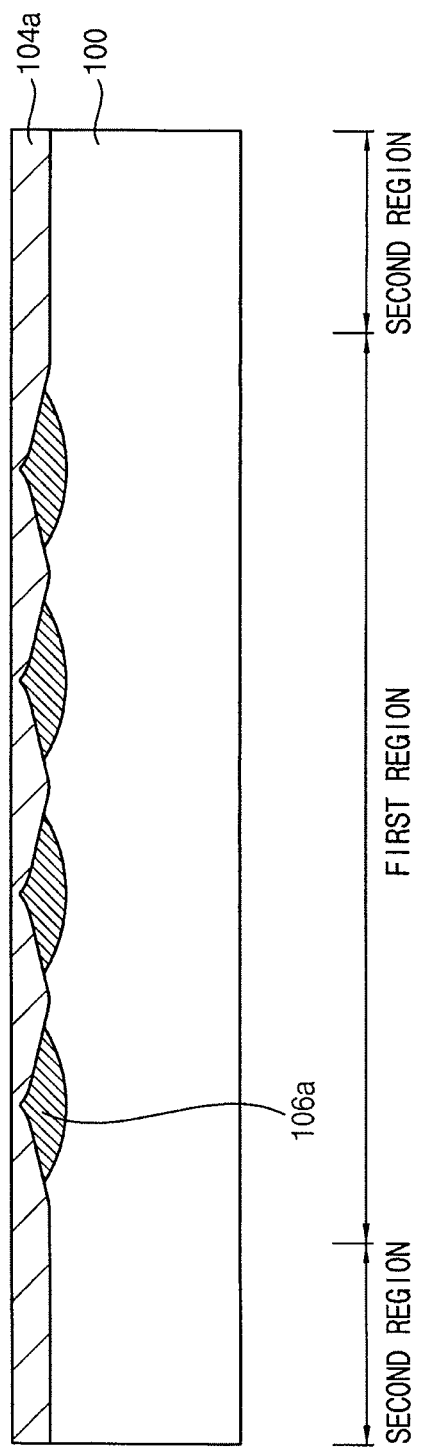

Referring to FIG. 16, impurities of the first and second preliminary impurity regions 104 and 106 may be diffused by a first drive-in process. By the first drive-in process, n-type impurities of the first preliminary impurity regions 104 may be diffused in the first and second directions, so that the first preliminary impurity regions 104 may be connected to each other to form a third preliminary impurity region 104a.

Further, by the first drive-in process, p-type impurities of the second preliminary impurity region 106 may be diffused in the first and second directions, so that a fourth preliminary impurity region 106a may be formed. The fourth preliminary impurity region 106a may contact the concave portion of the third preliminary impurity region 104a. However, the fourth preliminary impurity region 106a may not be formed at the second region of the base substrate 100. For example, the p-type impurities may not be doped in the second region of the base substrate 100. The first drive-in process may be substantially the same as those in FIG. 6.

Figure 17:
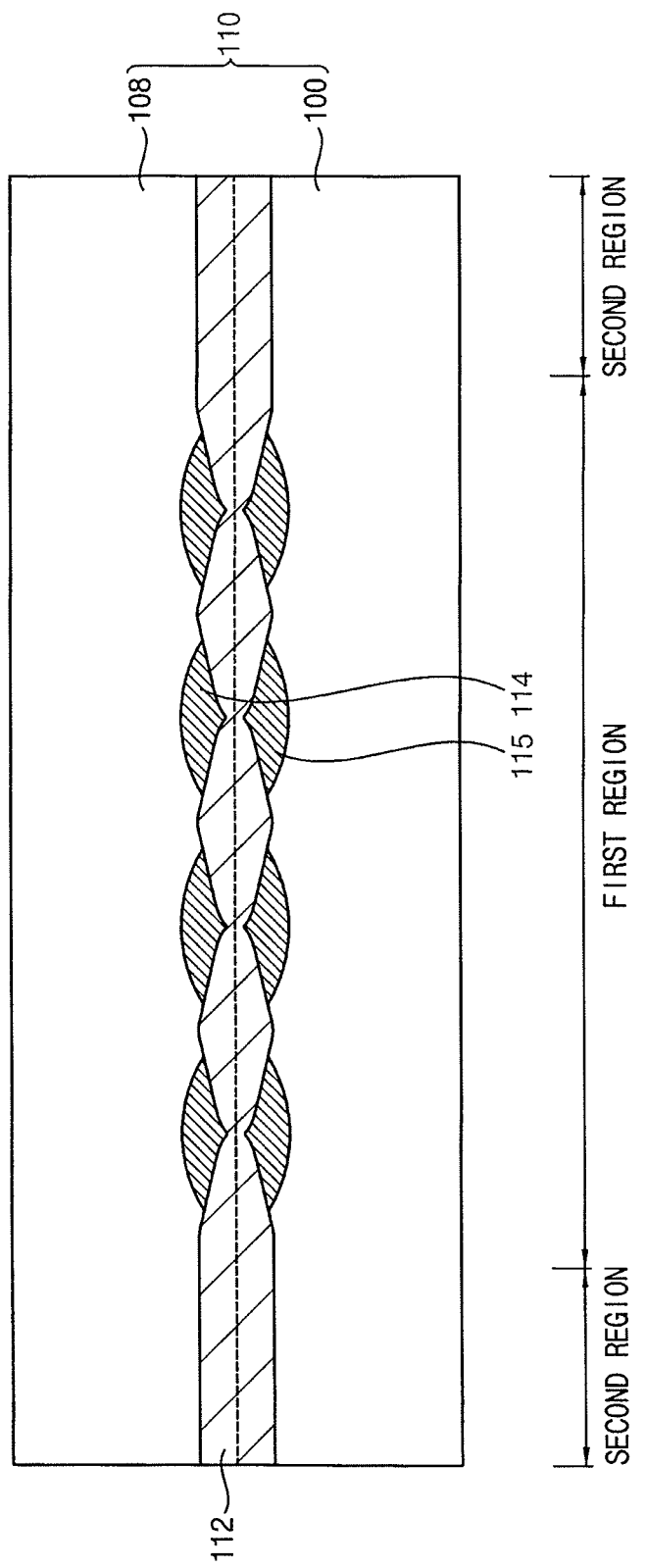

Referring to FIG. 17, an epitaxial layer 108 may be formed on the base substrate 100 by an epitaxial growth process. The epitaxial layer 108 may include, e.g., a semiconductor layer. The epitaxial layer 108 may have an optimized thickness to form a semiconductor device. For example, the epitaxial layer 108 may have a thickness of about 4 μm to about 10 μm. The thickness of the epitaxial layer 108 may be different in other embodiments.

A second drive-in process may be performed onto the substrate structure 110 including the base substrate 100 and epitaxial layer 108.

By the second drive-in process, n-type impurities of the third preliminary impurity region 104a may be diffused to the epitaxial layer 108, so that a first barrier impurity region 112 may be formed. Further, by the second drive-in process, p-type impurities of the fourth preliminary impurity region 106a may be diffused to the epitaxial layer 108, so that a second barrier impurity region 114 and a third barrier impurity region 115 may be formed.

The first barrier impurity region 112 may include a third portion overlapping the drain region in the first direction and a fourth portion that may be other portions of the first barrier impurity region 112. The third portion of the first barrier impurity region 112 may have a third width in the first direction smaller than a fourth width of the fourth portion of the first barrier impurity region 112. Each of the upper and lower surfaces of the first barrier impurity region 112 may have an uneven shape.

The second barrier impurity regions 114 may be formed on the concave portion of an upper surface of the first barrier impurity region 112. The third barrier impurity regions 115 may be formed on the concave portion of a lower surface of the first barrier impurity region 112. In example embodiments, the second and third barrier impurity regions 114 and 115 may be symmetric with respect to the first barrier impurity region 112.

The epitaxial growth process and the second drive-in process may be substantially the same as those in FIGS. 7 and 8, respectively.

Figure 18:
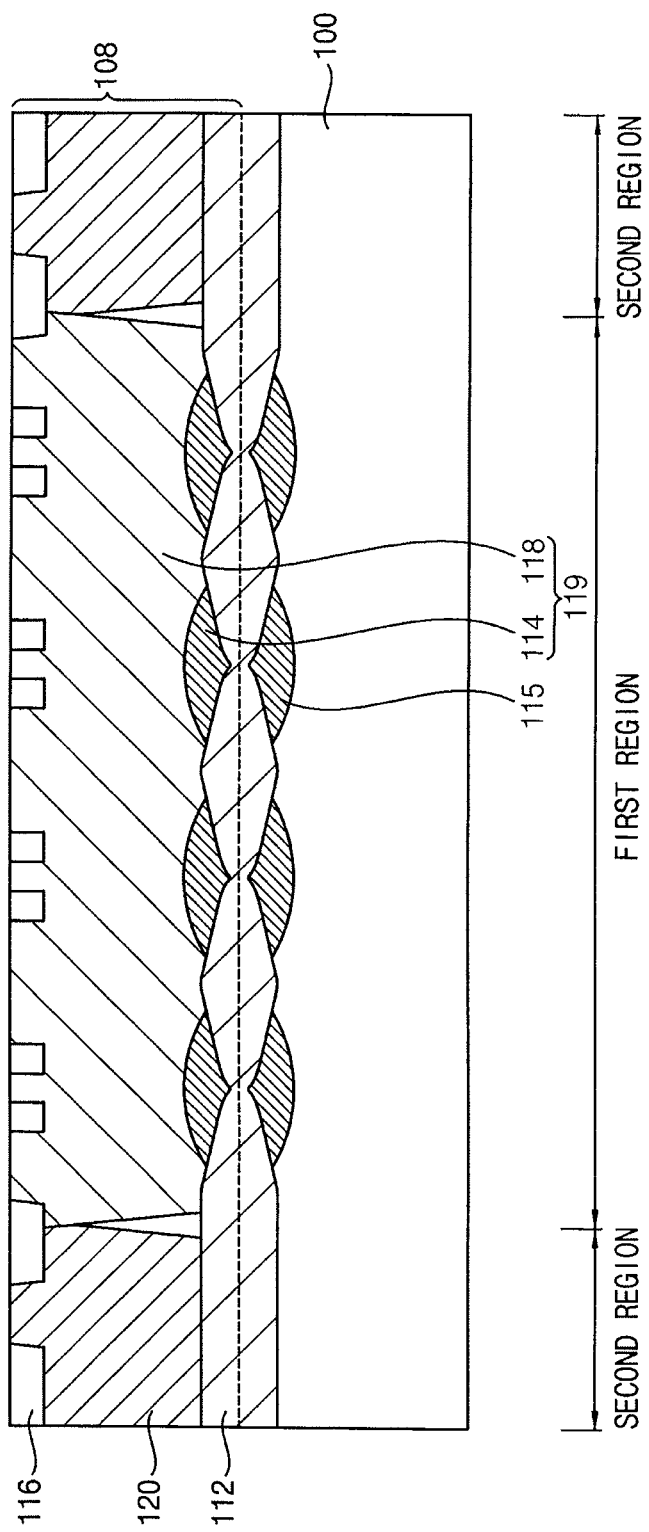

Referring to FIG. 18, an isolation pattern 116 may be formed at an upper portion of the substrate structure 110, for example, by a shallow trench isolation (STI) process. In example embodiments, a plurality of isolation patterns 116 may be formed. The drain region may be disposed between the isolation patterns 116 in the first region of the substrate structure 110. Also, a battery part may be between the isolation patterns 116 in the second region of the substrate structure.

P-type impurities may be doped onto the first region of the substrate structure 110 to form a p-type well region 118. Thus, a second well region 119 including the second barrier impurity region 114 and the p-type well region 118 may be formed. By doping the p-type impurities, an impurity concentration of the second barrier impurity region 114 may be increased. The second barrier impurity region 114 may have an impurity concentration higher than that of the p-type well region 118.

N-type impurities may be doped onto the second region of the substrate structure 110 to form a third well region 120 on the first barrier impurity region 112.

Figure 19:
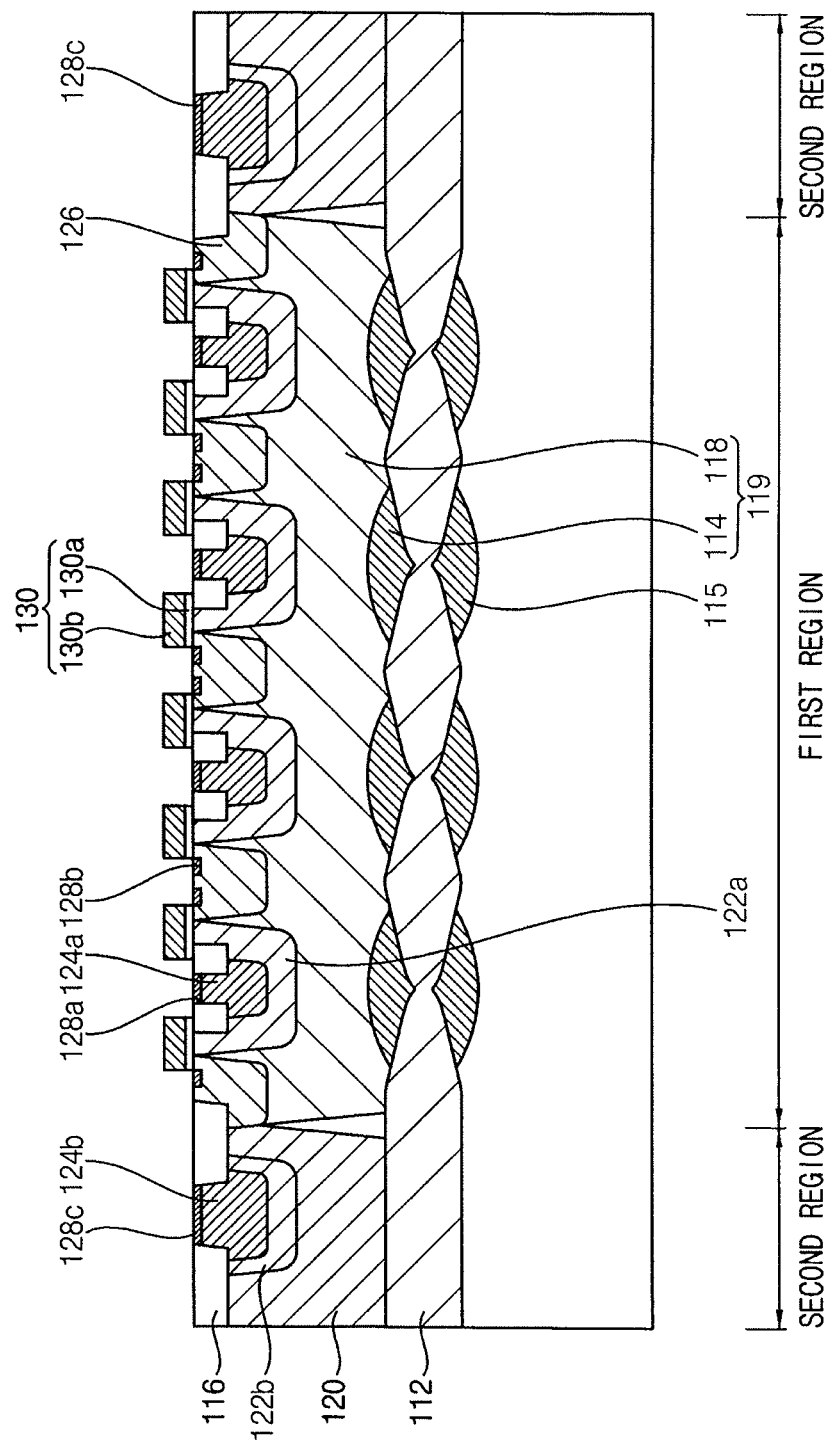

Referring to FIG. 19, p-type impurities may be doped onto a portion of the source region of the substrate structure 110 to form a P-body region 126. N-type impurities may be doped onto a portion of the drain region and a second region of the substrate structure 110 to form a first n-type drift region 122a and a second n-type drift region 122b, respectively. The first and second n-type drift regions 122a and 122b may be formed, for example, by the same doping process. Thus, the first and second n-type drift regions 122a and 122b may have substantially the same doping concentration and depth.

N-type impurities may be doped onto the first and second n-type drift regions 122a and 122b to respectively form a first well region 124a and a fourth well region 124b. The first and fourth well regions 124a and 124b may be formed, for example, by the same doping process. Thus, the first and fourth well regions 124a and 124b may have substantially the same doping concentration and depth.

A gate insulating layer and a gate electrode layer may be formed on the substrate structure 110. The gate insulating layer and a gate electrode layer may be patterned to form a gate electrode pattern 130. The gate electrode pattern 130 may include a gate insulating layer pattern 130a and a gate electrode 130b that are sequentially stacked.

N-type impurities may be doped onto the substrate structure 110 between the gate electrodes 130b to form first, second, and third impurity regions 128a, 128b, and 128c. The first and second impurity regions 128a and 128b may serve as drain and source regions of an isolated DMOS FET, respectively. The third impurity region 128c may serve as the battery part for connection to a battery. The first impurity region 128a may be formed in the first well region 124a of the substrate structure 110 between the isolation patterns 116. The second impurity region 128b may be formed in the P-body region 126.

Figure 20:
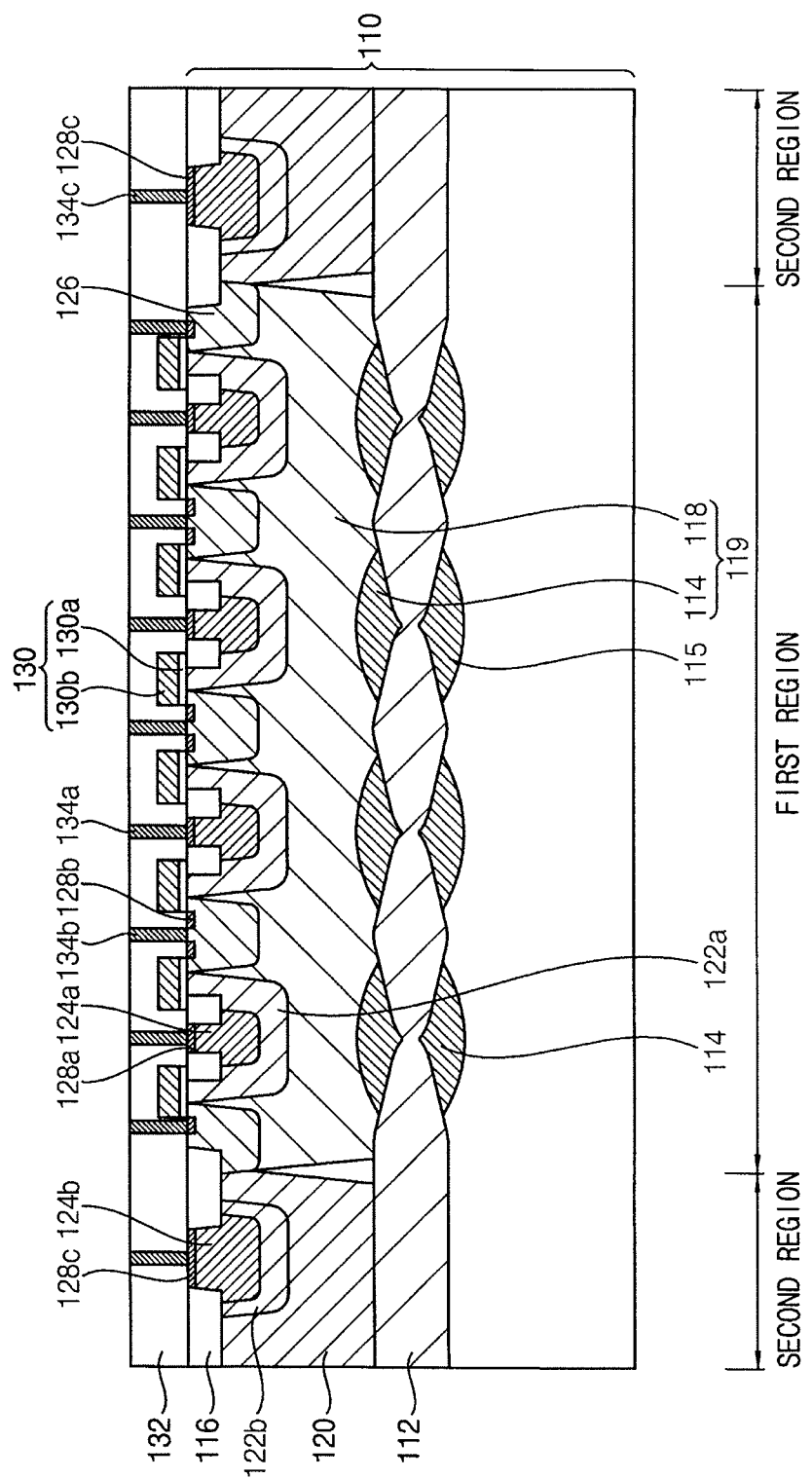

Referring to FIG. 20, an insulating interlayer 132 may be formed on the substrate structure 110 to cover the gate electrode pattern 130. The insulating interlayer 132 may include, for example, a silicon oxide. A first contact hole, a second contact hole, and a third contact hole may be formed through the insulating interlayer 132. A conductive material may fill in the first to third contact holes, so that a first contact plug 134a, a second contact plug 134b, and a third contact plug 134c may be respectively formed. Wiring structures may be formed on the first to third contact plugs 134a, 134b, and 134c. As a result of the aforementioned method, the semiconductor device of FIG. 12 may be manufactured.

The following Examples and Comparative Examples are provided for illustrative purposes in order to highlight characteristics of one or more embodiments. However, these Examples and Comparative Examples are not to be construed as limiting the scope of the embodiments, nor are the Comparative Examples necessarily to be construed as being outside the scope of the embodiments. Further, it will be understood that the embodiments are not limited to the particular details described in the Examples and Comparative Examples.

EXAMPLES 1 TO 3

Examples 1 to 3 were formed by processes substantially the same as those in FIGS. 14 to 20, except for widths in the second direction of ion implantation masks. The ion implantation masks had widths in the second direction, respectively, as shown in Table 1.

COMPARATIVE EXAMPLE

In a Comparative Example, n-type impurities were doped into the substrate structure with no ion implantation mask to form an n-type impurity region. Also, p-type impurities were not doped into the substrate structure, so that a preliminary second impurity region in FIG. 15 was not formed.

TABLE 1

|       | Example 1 | Example 2 | Example 3 | Comparative Example |
|-------|-----------|-----------|-----------|---------------------|
| Width | 0.5 μm    | 1.5 μm    | 1.8 μm    | 0 μm                |

Figure 21:
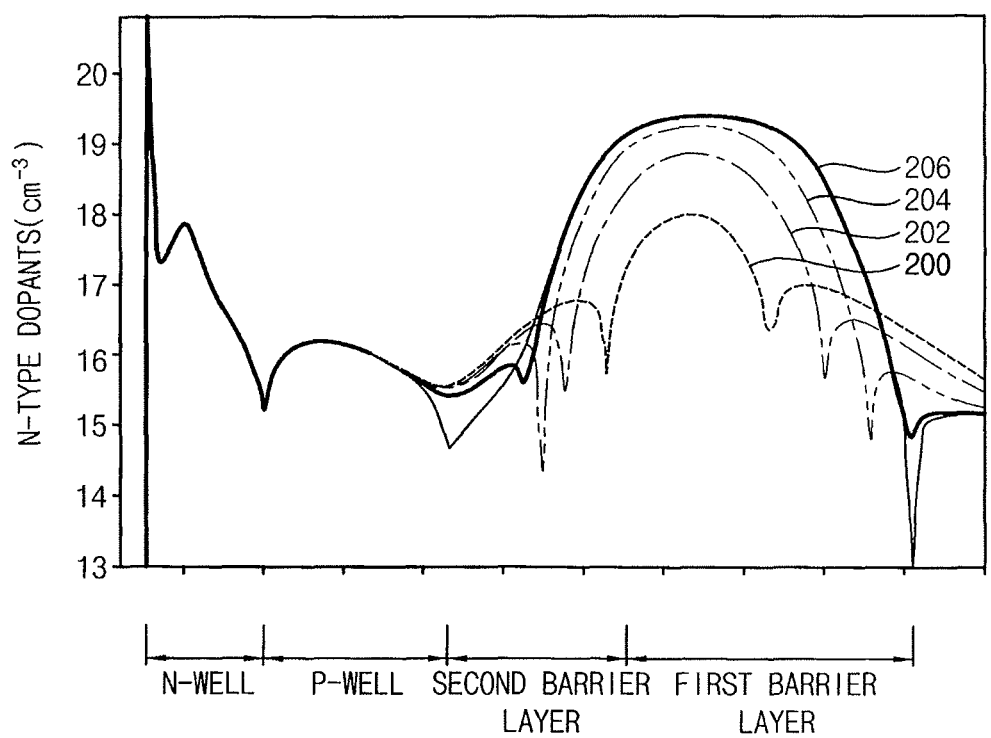
FIG. 21 illustrates doping profiles in substrate structures in drain regions of some Example embodiments and a Comparative Example.

FIG. 21 illustrates doping profiles in substrate structures under drain regions of Examples 1 to 3 and the Comparative Example. In FIG. 21, reference numerals 204, 202, and 200 represent doping profiles of Examples 1 to 3, respectively. The reference numeral 204 represents a doping profile of the Comparative Example.

Referring to FIG. 21, each of p-well regions had a low n-type impurity concentration. Each of second barrier impurity regions under each of p-well regions had a low n-type impurity concentration. Each of the second barrier impurity regions included a portion doped with p-type impurities. That is, the second barrier impurity regions had p-type impurity concentrations higher than those of the p-well regions. Each of first barrier impurity regions having a high n-type impurity concentration was formed under each of the second barrier impurity regions.

The width of the ion implantation mask of Example 3 was greater than those of Examples 1 and 2, so that a portion having a high p-type impurity concentration in the second barrier impurity region of Example 3 was lower than that of Examples 1 and 2. That is, the second barrier impurity region of Example 3 had a width in a first direction wider than those of Examples 1 and 2. Also, the first barrier impurity region of Example 3 had an impurity concentration lower than those of Examples 1 and 2.

According to increase of the width in the second direction of the ion implantation mask, a width in the first direction of the first barrier impurity region was increased, and dopants of the first barrier impurity region were decreased.

In the doping profile of the Comparative Example, an n-type impurity concentration of a portion of the second barrier region was gradually increased from the top surface of the substrate structure to bottom surface of the substrate structure. At a portion adjacent to the first barrier impurity region, a p-type impurity concentration was not increased. Therefore, the second impurity region having a high p-type impurity concentration was not formed.

As described above, each of the semiconductor devices of Examples 1 to 3 includes the second barrier impurity region having a high p-type impurity concentration on the first barrier impurity region.

Figure 22:
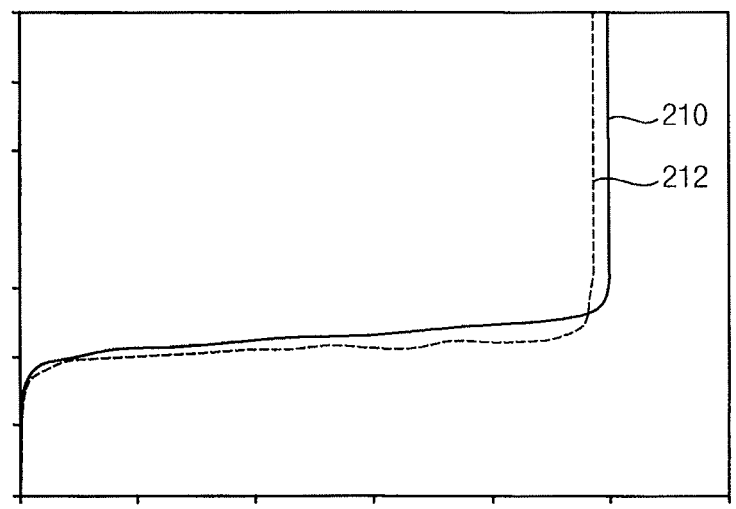
FIG. 22 illustrates breakdown voltages of an example embodiment and a Comparative Example.
Figure 23:
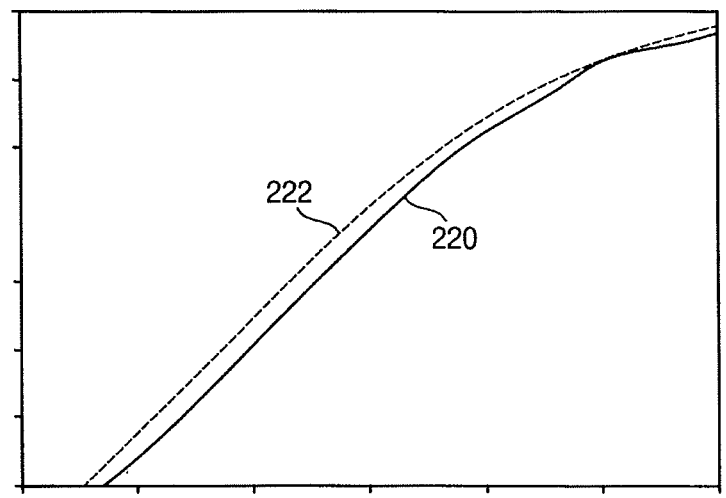
FIG. 23 illustrates a current of a battery part versus a current of a drain region of an example embodiment and a Comparative Example.

FIG. 22 illustrates breakdown voltages of Example 2 and the Comparative Example. FIG. 23 illustrates a current of a battery part versus a current of a drain region of Example 2 and the Comparative Example. In FIG. 22, reference numerals 210 and 212 represent results of Example 2 and the Comparative Example, respectively. In FIG. 23, reference numerals 220 and 222 represent results of Example 2 and Comparative Example, respectively.

Referring to FIG. 22, the breakdown voltages of Example 2 and the Comparative example had no significant difference. The upper and lower portions of the substrate structure 20 in Example 2 were electrically insulated. Referring to FIG. 23, currents of the battery part corresponded to collector currents of the parasitic NPN BJT. The currents of the battery part of Example 2 were smaller than that of the Comparative Example. The currents of the battery part of Example 2 had a reduction effect of about 37% when compared to the currents of the battery part of Comparative Example 2.

In accordance with the aforementioned embodiments, a semiconductor device having high performance may be manufactured. Such a semiconductor device may be used for a variety of purposes, including but not limited to a power device such as an active matrix organic light emitting diode (AMOLED) display or a power management integrated circuit (PMIC).

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A semiconductor device, comprising:
   at least one gate on a substrate structure;
   at least one drain region doped with impurities of a first conductivity type at a surface of the substrate structure spaced from a first side of the at least one gate;
   a first well region doped with impurities of the first conductivity type under the at least one drain region, the first well region adjacent to the at least one drain region;
   at least one source region doped with impurities of the first conductivity type at a surface of the substrate structure adjacent to a second side of the at least one gate;
   a first barrier impurity region doped with impurities of the first conductivity type in the substrate structure, the first barrier impurity region electrically insulating upper and lower portions of the substrate structure from each other; and
   a second barrier impurity region doped with impurities of a second conductivity type different from the first conductivity type on an upper surface of the first barrier impurity region, the second barrier impurity region having a first portion and a second portion, the first portion overlapping with the at least one drain region in a first direction which is substantially vertical relative to a top surface of the substrate structure, a lower surface of the first portion which overlaps with the at least one drain region being lower than a lower surface of the second portion.

2. The semiconductor device as claimed in claim 1, further comprising:
   a body region doped with impurities of the second conductivity type surrounding the source region and partially overlapping with the at least one gate; and
   a second well region doped with impurities of the second conductivity type on the first and the second barrier impurity regions, the second well region having an impurity concentration lower than an impurity concentration of the second barrier impurity region.

3. The semiconductor device as claimed in claim 1, further comprising: a third barrier impurity region coupled to a lower surface of the first barrier impurity region, the second and third barrier impurity regions being substantially symmetric with each other.

4. The semiconductor device as claimed in claim 1, wherein the second barrier impurity region is on a third portion of the first barrier impurity region, the third portion overlapping with the at least one drain region in the first direction.

5. The semiconductor device as claimed in claim 1, wherein the second barrier impurity region is on the first barrier impurity region and covers substantially an entire upper surface of the first barrier impurity region.

6. The semiconductor device as claimed in claim 1, wherein:
the first barrier impurity region has a third portion and a fourth portion,
the third portion overlaps with the at least one drain region in the first direction, and
the third portion has a first width in the first direction less than a second width of the fourth portion in the first direction.

7. The semiconductor device as claimed in claim 6, wherein:
upper and lower surfaces of the first barrier impurity region are uneven,
the fourth portion of the first barrier impurity region has a convex shape, and
the third portion of the first barrier impurity region has a concave shape.

8. The semiconductor device as claimed in claim 6, wherein the third portion of the first barrier impurity region has an impurity concentration lower than an impurity concentration of the fourth portion of the first barrier impurity region.

9. The semiconductor device as claimed in claim 6, wherein the first barrier impurity region has a smallest width in the first direction at a portion overlapping a center portion of the at least one drain region in a second direction substantially parallel to the top surface of the substrate structure.

10. The semiconductor device as claimed in claim 6, wherein the second barrier impurity region is on a portion of the first barrier impurity region having a smallest width in the first direction and a neighboring portion thereof.

11. The semiconductor device as claimed in claim 1, wherein:
the at least one gate includes a plurality of gate electrodes electrically connected with each other,
the at least one drain region includes a plurality of drain regions electrically connected with each other, and
the at least one source region includes a plurality of source regions electrically connected with each other.

12. The semiconductor device as claimed in claim 1, wherein:
the at least one gate is one of a plurality of gates, and
the semiconductor device includes battery parts at portions of the substrate structure adjacent ones of the plurality of gates at edge portions of the substrate structure.

13. The semiconductor device as claimed in claim 12, wherein each of the battery parts includes an impurity region doped with impurities of the first conductivity type, and extends from a surface of the substrate structure to the first barrier impurity region.

14. The semiconductor device as claimed in claim 12, wherein portions of the first barrier impurity region overlapping with the battery parts in the first direction have widths substantially equal to a greatest width of the first barrier impurity region under the at least one drain region and the at least one source region.

15. The semiconductor device as claimed in claim 1, wherein:
the substrate structure includes a base substrate,
the semiconductor device includes an epitaxial layer on the base substrate, and
the first barrier impurity region is at an interface between the base substrate and the epitaxial layer.

16. A semiconductor device, comprising:
first and second gates;
source regions adjacent respective ones of the first and second gates;
a drain region between the first and second gates;
a well region under the drain region;
a first barrier impurity region under the well region; and
a second barrier impurity region between the first barrier impurity region and the well region, wherein a lower surface of the second barrier impurity region at a first point under the drain region is lower than the lower surface of the second barrier impurity region at a second point that does not overlap with the drain region, wherein the first and second gates, the source regions, and the drain region correspond to a double diffused metal oxide silicon field effect transistor, and wherein the drain region, the first barrier impurity region, and the second barrier impurity region correspond to an emitter electrode, a collector electrode, and a base electrode of a parasitic bipolar junction transistor.

17. The semiconductor device as claimed in claim 16, wherein the second barrier impurity region has a first width along a central axis of the drain region and second widths spaced from the central axis, wherein the first width is greater than the second widths.

18. The semiconductor device as claimed in claim 17, wherein a width of the base electrode is based on the first width of the second barrier impurity region.

19. The semiconductor device as claimed in claim 16, wherein the second barrier impurity region has a higher impurity concentration than the first barrier impurity region.

20. The semiconductor device as claimed in claim 16, wherein a portion of the first barrier impurity region under the drain region has a lower impurity concentration than a portion of the first barrier impurity region under the source regions.

* * * * *